US012696763B2

(12) United States Patent
Liang et al.

(10) Patent No.: US 12,696,763 B2
(45) Date of Patent: Jul. 28, 2026

(54) HEAT DISSIPATION IN SEMICONDUCTOR DEVICES

(71) Applicant: Taiwan Semiconductor Manufacturing Co., Ltd., Hsinchu (TW)

(72) Inventors: Zheng-Yong Liang, Kaohsiung City (TW); Wei-Ting Yeh, Hsinchu (TW); Han-De Chen, Hsinchu (TW); Chen-Fong Tsai, Hsinchu (TW); Yu-Yun Peng, Hsinchu (TW); Keng-Chu Lin, Ping-Tung (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 361 days.

(21) Appl. No.: 18/345,248

(22) Filed: Jun. 30, 2023

(65) Prior Publication Data

US 2025/0006687 A1 Jan. 2, 2025

(51) Int. Cl.
*H10W 40/25* (2026.01)
*H10D 86/01* (2026.01)
(Continued)

(52) U.S. Cl.
CPC ...... *H10W 40/255* (2026.01); *H10D 86/0214* (2025.01); *H10W 72/01338* (2026.01);
(Continued)

(58) Field of Classification Search
CPC ......... H01L 24/03; H01L 24/29; H01L 24/32;
H01L 24/83; H01L 23/3735; H01L 24/27;
H01L 21/76897; H01L 23/5286; H01L
24/16; H01L 24/81; H01L 24/11; H01L
24/13; H01L 2224/32505; H01L
2924/0534; H01L 2224/32225; H01L
2224/29376; H01L 2924/0543; H01L
2224/27845; H01L 2224/05644;
(Continued)

(56) References Cited

U.S. PATENT DOCUMENTS

| 6,541,904 B1 * | 4/2003 | Compen | ............... | H01J 29/896 |
| | | | | 313/461 |
| 9,209,247 B2 | 12/2015 | Colinge et al. | | |

(Continued)

FOREIGN PATENT DOCUMENTS

| TW | 200834909 A | 8/2008 |
| TW | 201733053 A | 9/2017 |

(Continued)

*Primary Examiner* — Mouloucoulaye Inoussa
(74) *Attorney, Agent, or Firm* — Slater Matsil, LLP

(57) ABSTRACT

An integrated circuit die with two material layers having metal nano-particles and the method of forming the same are provided. The integrated circuit die includes a device layer comprising a first transistor, a first interconnect structure on a first side of the device layer, a first material layer on the first interconnect structure, wherein the first material layer comprises first metal nano-particles, and a second material layer bonded to the first material layer, wherein the second material layer comprises second metal nano-particles, and wherein the first material layer and the second material layer share an interface.

20 Claims, 56 Drawing Sheets

200

(51) Int. Cl.

| | |
|---|---|
| *H10W 72/00* | (2026.01) |
| *H10W 72/29* | (2026.01) |
| *H10W 72/30* | (2026.01) |
| *H10W 72/90* | (2026.01) |
| *H10W 90/00* | (2026.01) |

(52) U.S. Cl.
CPC     *H10W 72/01359* (2026.01); *H10W 72/07311* (2026.01); *H10W 72/07331* (2026.01); *H10W 72/07355* (2026.01); *H10W 72/29* (2026.01); *H10W 72/325* (2026.01); *H10W 72/351* (2026.01); *H10W 72/352* (2026.01); *H10W 72/353* (2026.01); *H10W 72/856* (2026.01); *H10W 72/90* (2026.01); *H10W 72/952* (2026.01); *H10W 90/734* (2026.01)

(58) Field of Classification Search
CPC . H01L 2224/05655; H01L 2224/05573; H01L 2224/05647; H01L 2224/83896; H01L 2224/73153; H01L 2224/0401; H01L 2924/0542; H01L 2224/81799; H01L 2224/16503; H01L 2224/13111; H01L 2224/81815; H01L 2224/81647; H01L 2224/81669; H01L 2224/81684; H01L 2224/81639; H01L 2224/81511; H01L 2924/014; H10D 30/501; H10D 62/151; H10D 30/0198; H10D 64/017; H10D 64/2565; H10D 30/019; H10D 62/822; H10D 30/797; H10D 86/0214; H10D 30/6735; H10D 30/6219; H10D 30/6211; H10D 30/024; H10D 30/6729; H10D 30/6713; H10D 30/6757; H10D 30/62; C22C 13/02; C22C 1/0466; C22C 1/0483; C22C 1/0425; B23K 35/262; B23K 35/0244; B23K 35/025; B23K 35/264; B23K 2101/40; C22F 1/16; B22F 1/06; B22F 1/0553; B22F 1/142; B22F 1/10; B22F 7/064; B22F 1/056; B22F 7/08; B22F 2202/01; B22F 2304/058

See application file for complete search history.

(56)                References Cited

U.S. PATENT DOCUMENTS

| | | | |
|---|---|---|---|
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2007/0131912 A1* | 6/2007 | Simone | C09J 9/02 252/500 |
| 2010/0110652 A1* | 5/2010 | Takane | H05K 1/14 977/932 |
| 2012/0261819 A1* | 10/2012 | Brunschwiler | H01L 21/56 257/734 |
| 2012/0282455 A1* | 11/2012 | Hao | C09J 7/38 428/317.5 |
| 2018/0251663 A1* | 9/2018 | Trumble | C08L 83/00 |
| 2019/0074347 A1 | 3/2019 | Funaki et al. | |
| 2019/0252348 A1* | 8/2019 | Michiaki | H01L 24/83 |
| 2020/0010740 A1* | 1/2020 | Lee | H01L 24/13 |
| 2020/0075534 A1 | 3/2020 | Gao et al. | |
| 2021/0335709 A1* | 10/2021 | Wang | H10D 30/014 |
| 2021/0335783 A1* | 10/2021 | Chiu | H10D 30/6735 |
| 2021/0336020 A1* | 10/2021 | Yu | H10D 84/013 |
| 2021/0358891 A1* | 11/2021 | Chuang | H01L 25/18 |
| 2021/0375761 A1* | 12/2021 | Chang | H10D 84/0167 |
| 2021/0376094 A1* | 12/2021 | Lin | H10D 84/038 |
| 2021/0376155 A1* | 12/2021 | Chang | H10D 64/018 |
| 2021/0408247 A1* | 12/2021 | Yu | H10D 62/021 |
| 2021/0408249 A1* | 12/2021 | Yu | H01L 23/5283 |
| 2022/0028752 A1* | 1/2022 | Huang | H10D 30/43 |
| 2022/0028994 A1* | 1/2022 | Chen | H10D 62/151 |
| 2023/0200035 A1* | 6/2023 | Kong | C09J 9/00 257/659 |
| 2023/0215781 A1* | 7/2023 | Sutherland | H01L 23/473 361/699 |
| 2023/0311274 A1* | 10/2023 | Duescher | B24D 11/001 451/527 |
| 2023/0369531 A1* | 11/2023 | Noda | H10H 29/49 |
| 2024/0100634 A1* | 3/2024 | Jang | C22C 13/02 |

FOREIGN PATENT DOCUMENTS

| | | | |
|---|---|---|---|
| TW | 201806095 A | 2/2018 | |
| TW | 201830537 A | 8/2018 | |
| TW | 202025393 A | 7/2020 | |
| WO | 2008059940 A1 | 5/2008 | |
| WO | 2017111957 A1 | 6/2017 | |

* cited by examiner 151A
155A
153A
152A
152B
155B
153B
151B

152

200

HEAT DISSIPATION IN SEMICONDUCTOR DEVICES

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
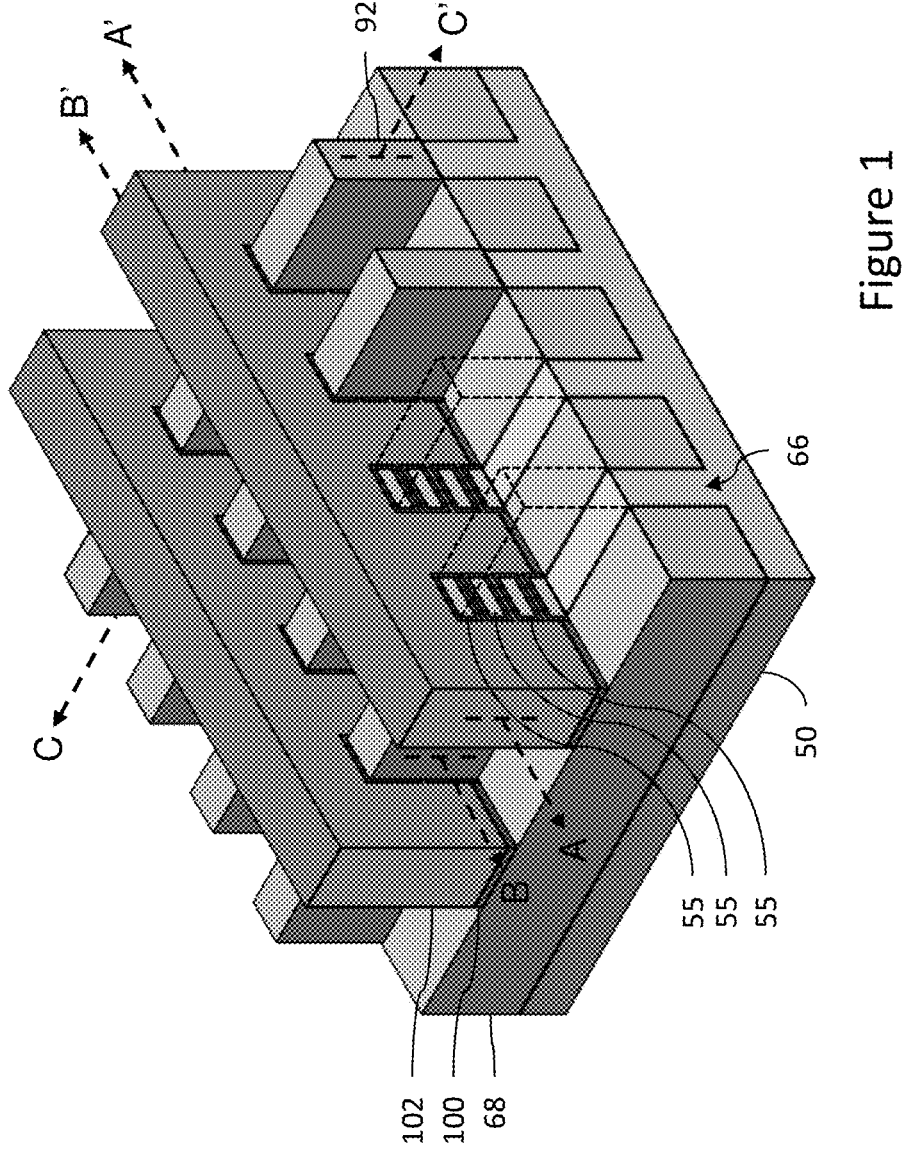
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide heat dissipation on an integrated circuit die bonded to a support substrate by directly bonding two bonding layers. Each of the two bonding layers may comprise a base layer and nanoparticles embedded in the base layer. The base layers may comprise materials with high thermal conductivities, such as a metal oxide layer. The nanoparticles may comprise materials with even higher thermal conductivities than the base layers. For example, the nanoparticles be made of a metal with high thermal conductivity (high-kappa), such as silver, ruthenium, niobium, or the like. As a result, the two bonding layers may have high thermal conductivities, which lead to effective heat dissipation of the integrated circuit dies during operation, thereby improving the performance and reliability of the integrated circuit die.

Some embodiments discussed herein are described in the context of an integrated circuit die, such as a super power rail (SPR) die, including nano-FETs. However, various embodiments may be applied to dies including other types of transistors (e.g., fin field effect transistors (FinFETs), vertical field-effect transistors (VFETs), complementary field-effect transistors (CFETs), planar transistors, or the like) in lieu of or in combination with the nano-FETs. Further, embodiments discussed herein are described in the context of bonding a support substrate to an interconnect structure of an integrated circuit die. However, various embodiments may be applied to other structures, such as, bonding within three-dimensional integrated circuit (3DIC) packages, integrated Fan-Out (InFO) packages, power distribution networks (PDNs), chiplets, wafer stacks, or the like.

FIG. 1 illustrates an example of nano-FETs (e.g., nanowire FETs, nanosheet FETs, or the like) in a three-dimensional view. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the STI regions. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring STI regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is parallel to cross-section A-A' and extends through epitaxial source/drain regions 92 of multiple nano-FETs. Cross-section C-C' is perpendicular to cross-section A-A' and is parallel to a longitudinal axis of a fin 66 of the nano-FET and in a direction of, for example, a current flow between the epitaxial source/drain regions 92 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in FinFETs.

FIGS. 2 through 28C are cross-sectional views of intermediate stages in the manufacturing of a semiconductor die including nano-FETs, in accordance with some embodiments. FIGS. 2 through 5, 6A, 7A, 8A, 9A, 10A, 11A, 12A, 13A, 14A, 15A, 16A, 17A, 18A, 19A, 20A, 21A, 22A, 23A, 24A, 25A, 26A, 27A, and 28A illustrate reference cross-section A-A' illustrated in FIG. 1. FIGS. 6B, 7B, 8B, 9B, 10B, 11B, 12B, 12D, 13B, 14B, 15B, 16B, 17B, 18B, 19B, 20B, 21B, 22B, 23B, 24B, 25B, 26B, 27B, and 28B illustrate reference cross-section B-B' illustrated in FIG. 1. FIGS. 7C, 8C, 9C, 10C, 11C, 11D, 12C, 12E, 13C, 14C, 15C, 16C, 17C, 18C, 19C, 20C, 21C, 22C, 23C, 24C, 25C, 26C, 27C, and 28C illustrate reference cross-section C-C' illustrated in FIG. 1.

Figure 2:
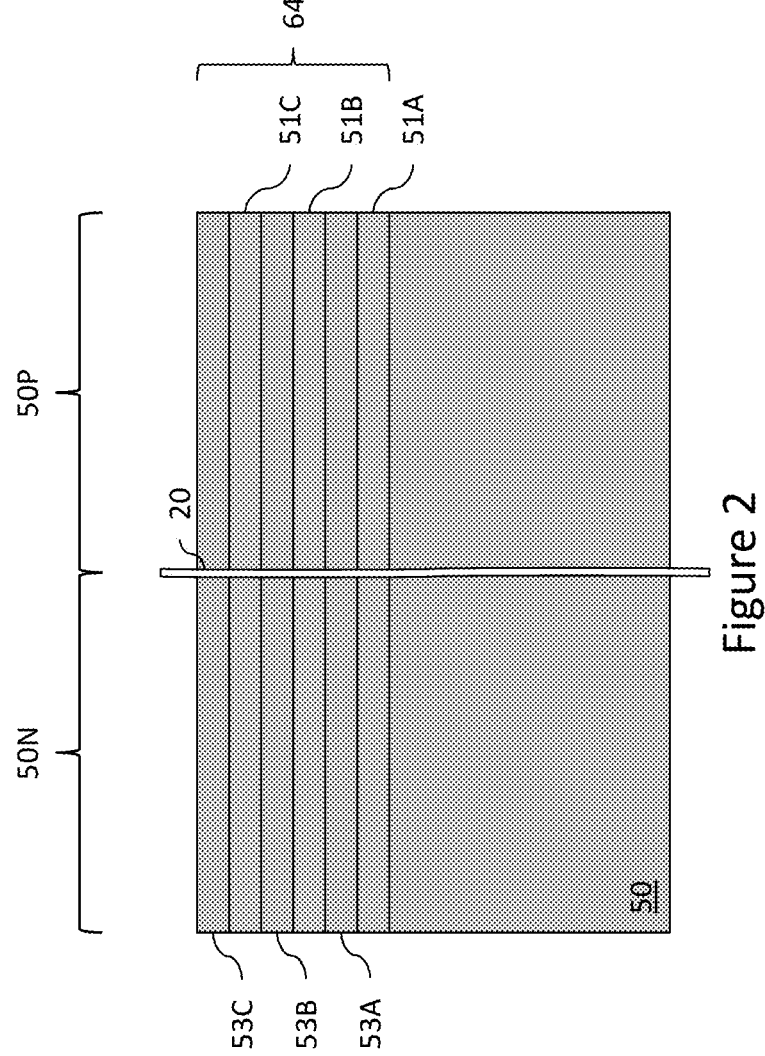
FIGS. 2, 3, 4, 5, 6A, 6B, 6C, 7A, 7B, 7C, 8A, 8B, 8C, 9A, 9B, 9C, 10A, 10B, 10C, 11A, 11B, 11C, 11D, 12A, 12B, 12C, 12D, 12E, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, 21D, 22A, 22B, 22C, 22D, 22E, 23A, 23B, 23C, 24A, 24B, 24C, 25A, 25B, 25C, 26A, 26B, 26C, 27A, 27B, 27C, 28A, 28B, and 28C are cross-sectional views of intermediate stages in the manufacturing of an integrated circuit die, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-51C (collectively referred to as first semiconductor layers 51) and second semiconductor layers 53A-53C (collectively referred to as second semiconductor layers 53). For purposes of illustration and as discussed in greater detail below, the first semiconductor layers 51 will be removed and the second semiconductor layers 53 will be patterned to form channel regions of nano-FETs in the n-type region 50N and the p-type region 50P. However, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P. In some embodiments the second semiconductor layers 53 may be removed and the first semiconductor layers 51 may be patterned to form channel regions of nano-FETs in the n-type region 50N, and the first semiconductor layers 51 may be removed and the second semiconductor layers 53 may be patterned to form channel regions of nano-FETs in the p-type region 50P. In some embodiments, the second semiconductor layers 53 may be removed and the first semiconductor layers 51 may be patterned to form channel regions of nano-FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material, such as silicon germanium or the like, and the second semiconductor layers 53 may be formed of a second semiconductor material different from the first semiconductor material, such as silicon, carbon-doped silicon, or the like.

The first semiconductor materials and the second semiconductor materials may be materials having a high etch selectivity to one another. As such, the first semiconductor layers 51 of the first semiconductor material may be removed without significantly removing the second semiconductor layers 53 of the second semiconductor material thereby allowing the second semiconductor layers 53 to be patterned to form channel regions of nano-FETs. Similarly, In the embodiments in which the second semiconductor layers 53 are removed and the first semiconductor layers 51 are patterned to form channel regions, the second semiconductor layers 53 of the second semiconductor material may be removed without significantly removing the first semiconductor layers 51 of the first semiconductor material, thereby allowing the first semiconductor layers 51 to be patterned to form channel regions of nano-FETs.

Figure 3:
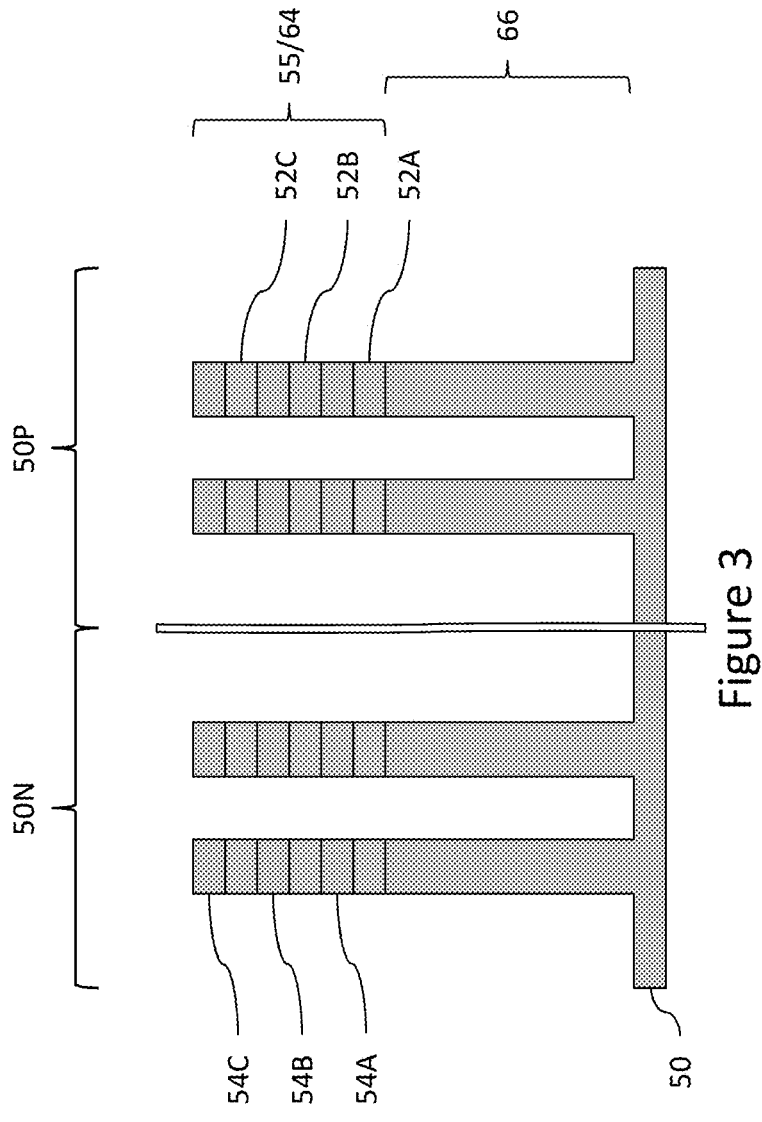

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and define second nanostructures 54A-54C (collectively referred to as the second nanostructures 54) from the second semiconductor layers 53. The first nanostructures 52 and the second nanostructures 54 may be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
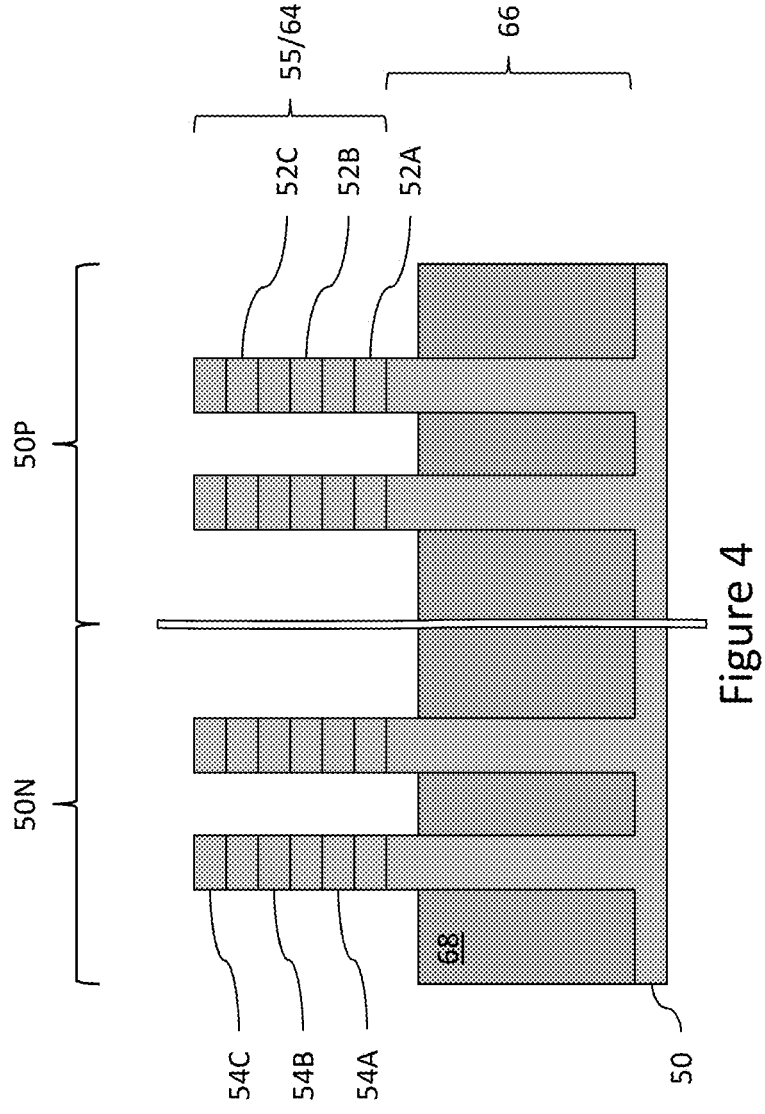

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In the embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an annealing may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
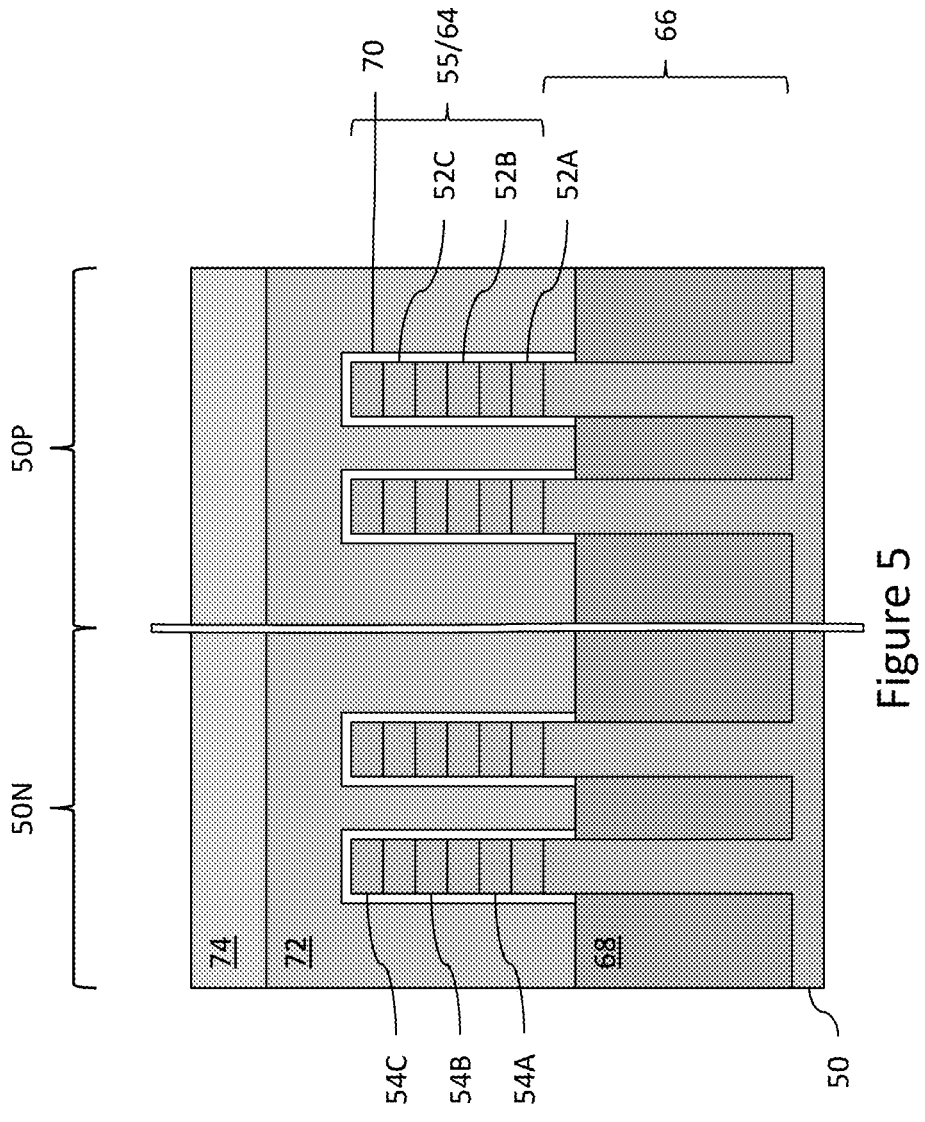

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6B:
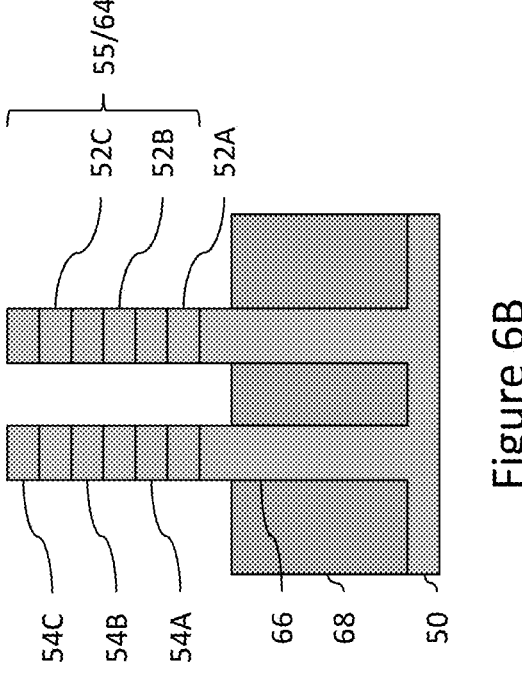
Figure 6A:
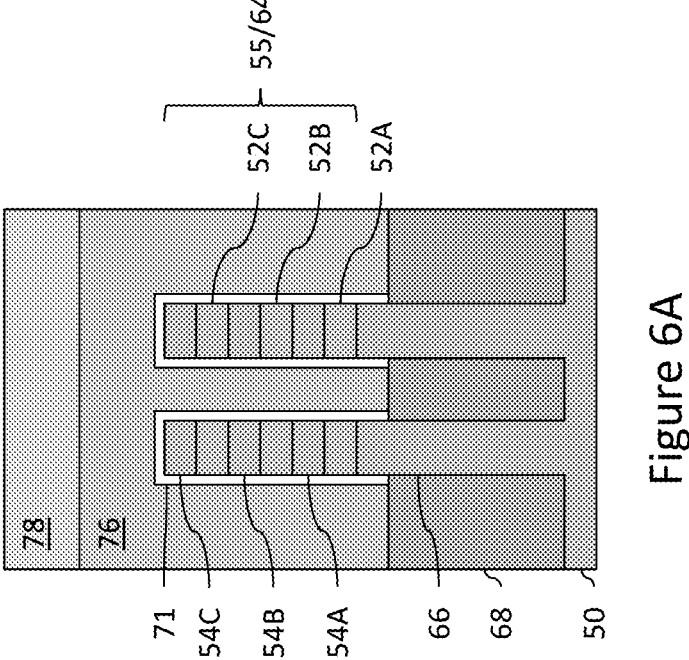
Figure 6C:
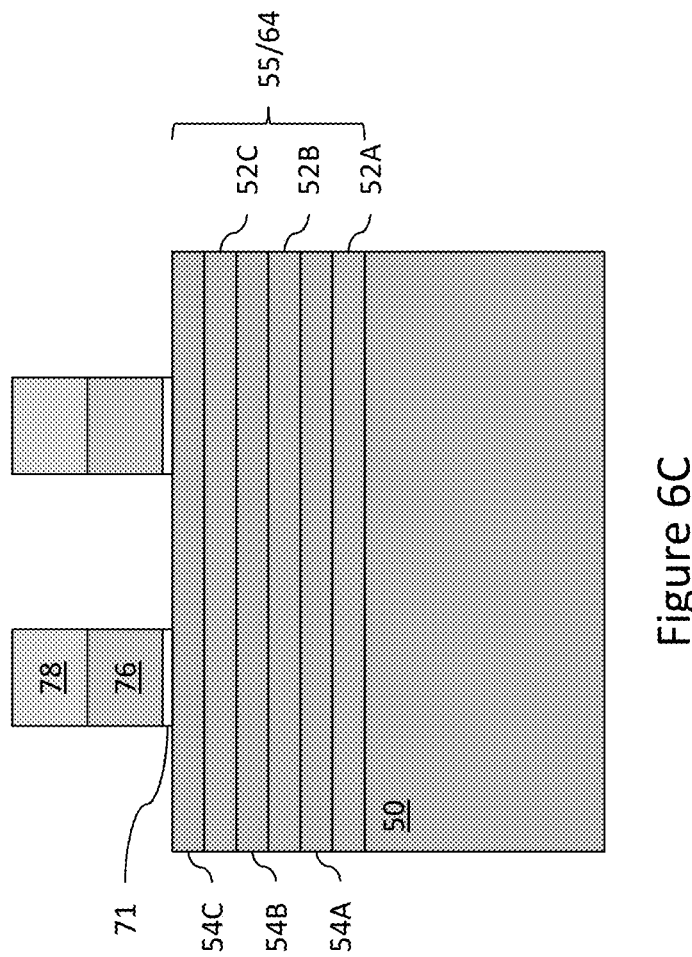

FIGS. 6A through 18C illustrate various additional steps in the manufacturing of embodiment nano-FET devices. FIGS. 6A through 18C illustrate features in either the n-type region 50N or the p-type region 50P. In FIGS. 6A through 6C, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7B:
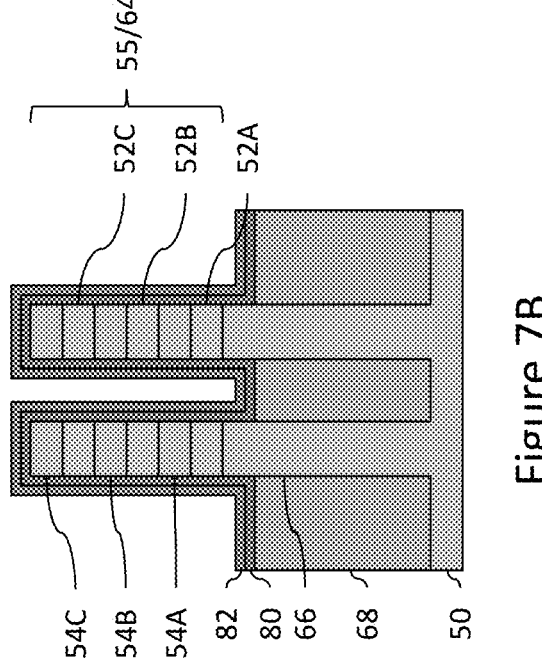
Figure 7A:
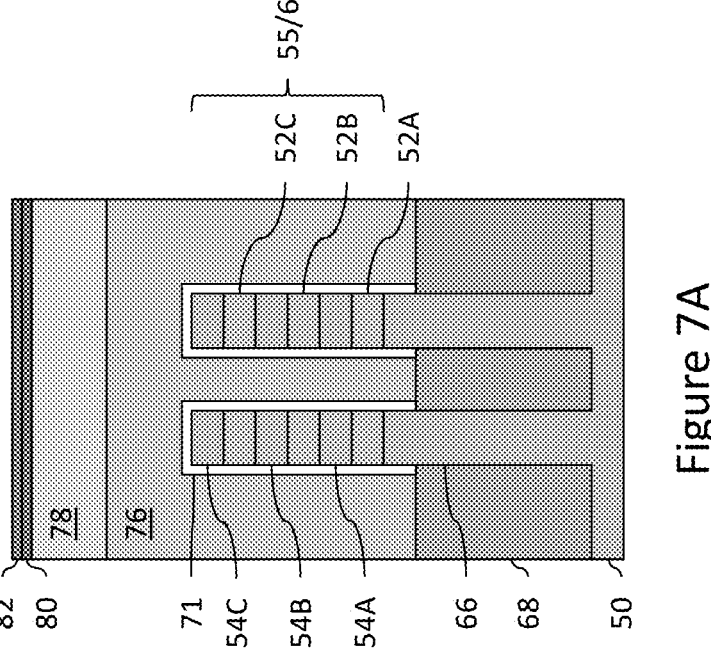
Figure 7C:
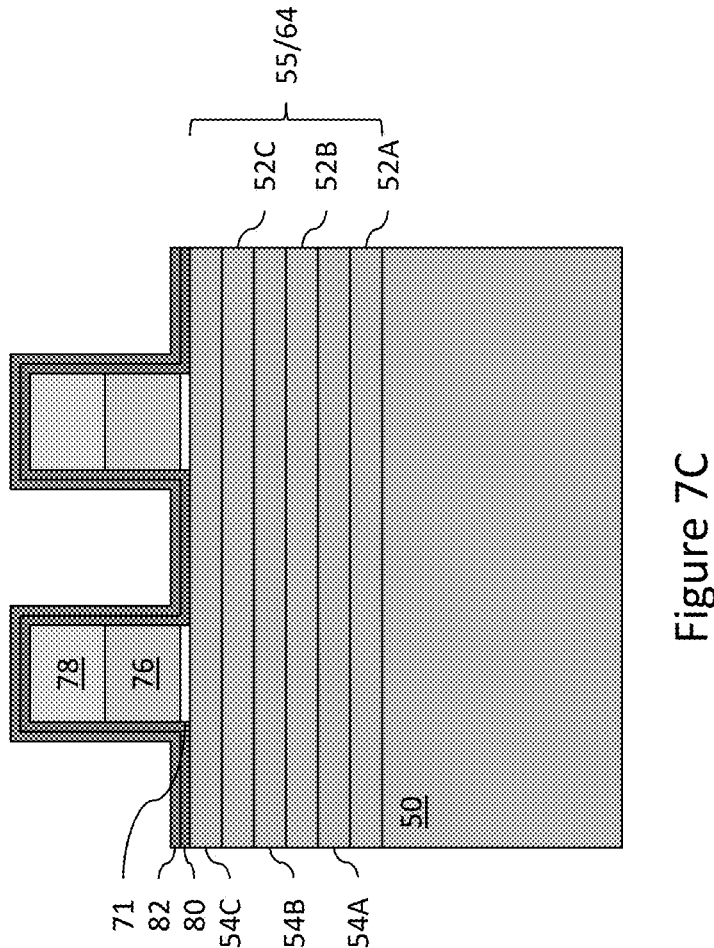

In FIGS. 7A through 7C, a first spacer layer 80 and a second spacer layer 82 are formed over the structures illustrated in FIGS. 6A through 6C. The first spacer layer 80 and the second spacer layer 82 will be subsequently patterned to act as spacers for forming self-aligned source/drain regions. In FIGS. 7A through 7C, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In the embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1 \times 10^{15}$ atoms/cm$^3$ to about $1 \times 10^{19}$ atoms/cm$^3$. An annealing may be used to repair implant damage and to activate the implanted impurities.

Figure 8B:
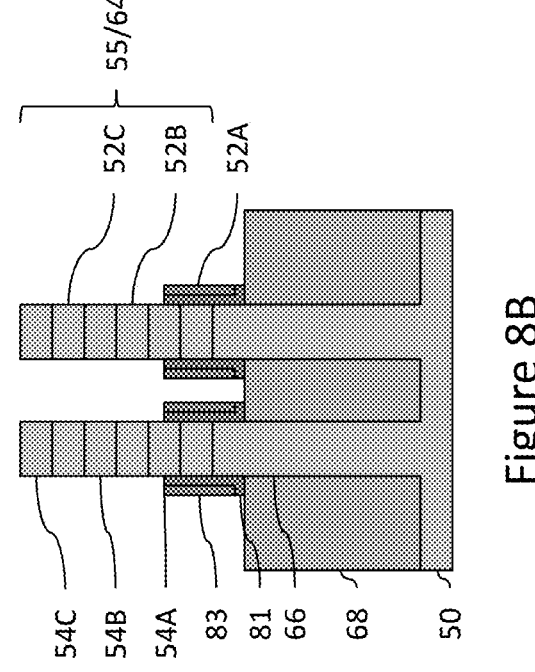
Figure 8A:
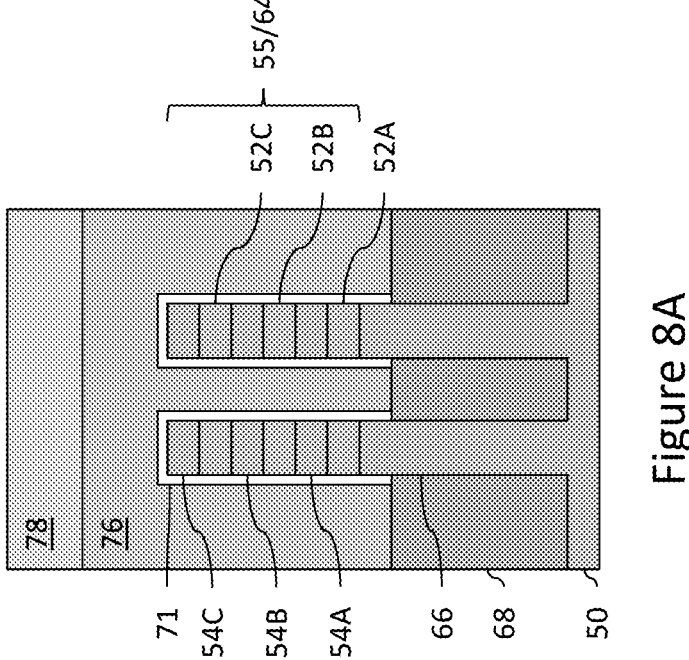
Figure 8C:
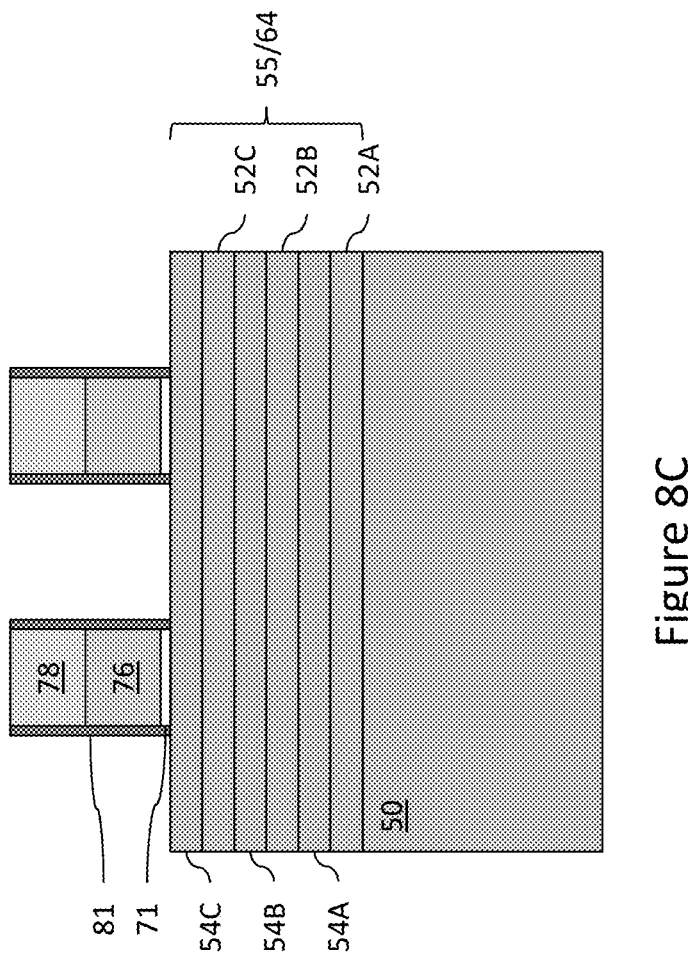

In FIGS. 8A through 8C, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8B. Thereafter, the second spacers 83 acts as a mask while etching exposed portions of the first spacer layer 80, thereby forming first spacers 81 as illustrated in FIGS. 8B and 8C.

As illustrated in FIG. 8B, the first spacers 81 and the second spacers 83 are disposed on sidewalls of the fins 66 and/or nanostructures 55. As illustrated in FIG. 8C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9B:
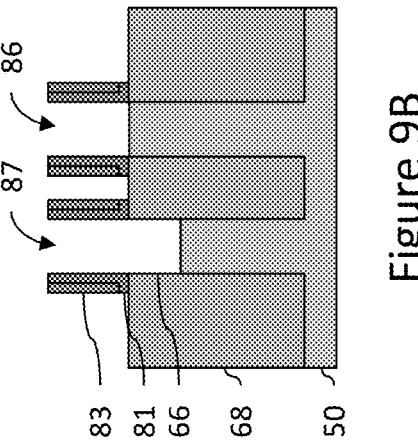
Figure 9A:
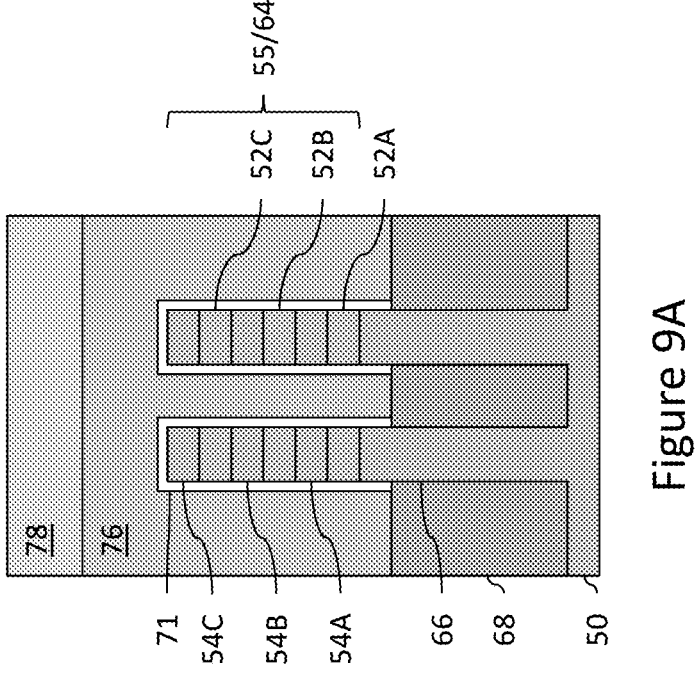
Figure 9C:
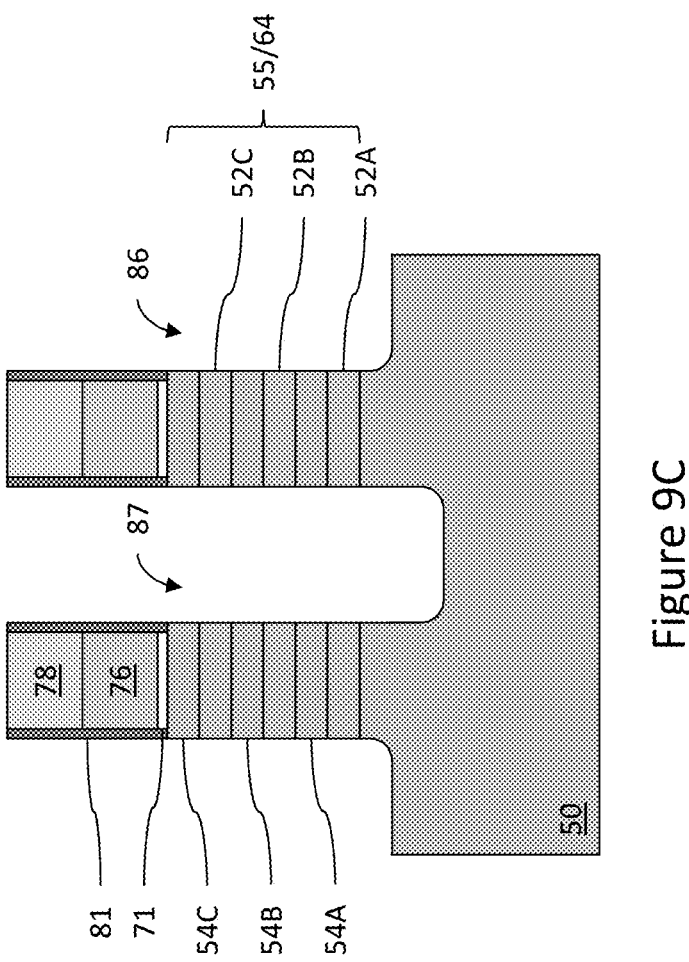

In FIGS. 9A through 9C, first recesses 86 and second recesses 87 are formed in the fins 66, the nanostructures 55, and the substrate 50, in accordance with some embodiments. Epitaxial source/drain regions will be subsequently formed in the first recesses 86 and first epitaxial materials (e.g., a sacrificial material) and epitaxial source/drain regions will be subsequently formed in the second recesses 87. The first recesses 86 and the second recesses 87 may extend through the first nanostructures 52 and the second nanostructures 54, and into the substrate 50. As illustrated in FIG. 9B, top surfaces of the STI regions 68 may be level with bottom surfaces of the first recesses 86. In various embodiments, the fins 66 may be etched such that bottom surfaces of the first recesses 86 are disposed below the top surfaces of the STI regions 68 or the like. Bottom surfaces of the second recesses 87 may be disposed below the bottom surfaces of the first recesses 86 and the top surfaces of the STI regions 68. The first recesses 86 and the second recesses 87 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86 and the second recesses 87. A single etch process or multiple etch processes may be used to etch each layer of the nanostructures 55 and/or the fins 66. Timed etch processes may be used to stop the etching after the first recesses 86 and the second recesses 87 reach desired depths. The second recesses 87 may be etched by the same processes used to etch the first recesses 86 and an additional etch process before or after the first recesses 86 are etched. In some embodiments, regions corresponding to the first recesses 86 may be masked while the additional etch process for the second recesses 87 is performed.

Figure 10B:
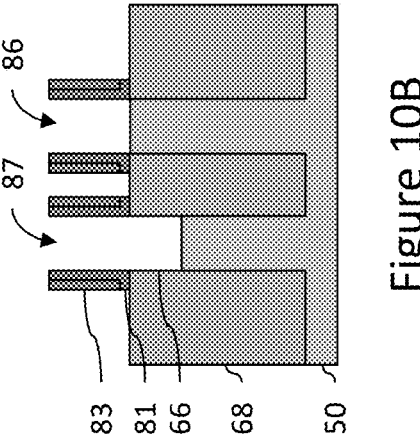
Figure 10A:
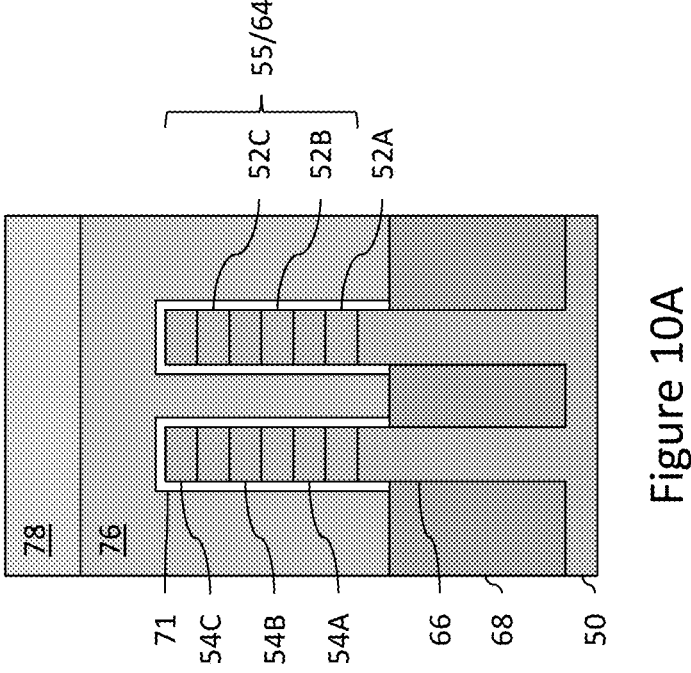
Figure 10C:
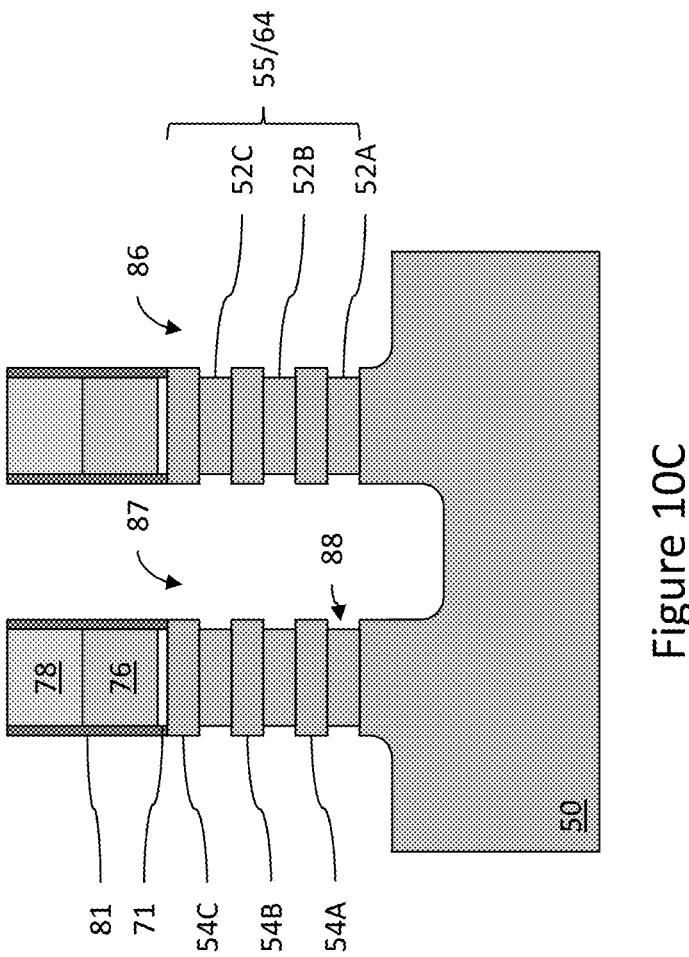

In FIGS. 10A through 10C, portions of sidewalls of the layers of the multi-layer stack 64 formed of the first semiconductor materials (e.g., the first nanostructures 52) exposed by the first recesses 86 and the second recesses 87 are etched to form sidewall recesses 88. Although sidewalls of the first nanostructures 52 adjacent the sidewall recesses 88 are illustrated as being straight in FIG. 10C, the sidewalls may be concave or convex. The sidewalls may be etched using isotropic etching processes, such as wet etching or the like. In an embodiment in which the first nanostructures 52 include, e.g., SiGe, and the second nanostructures 54 include, e.g., Si or SiC, a dry etch process with tetramethylammonium hydroxide (TMAH), ammonium hydroxide ($NH_4OH$), or the like may be used to etch sidewalls of the first nanostructures 52.

In FIGS. 11A through 11D, first inner spacers 90 are formed in the sidewall recess 88. The first inner spacers 90 may be formed by depositing an inner spacer layer (not separately illustrated) over the structures illustrated in FIGS. 10A through 10C. The first inner spacers 90 act as isolation features between subsequently formed source/drain regions and a gate structure. As will be discussed in greater detail below, source/drain regions and epitaxial materials will be formed in the first recesses 86 and the second recesses 87, while the first nanostructures 52 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54, the outer sidewalls of the first inner spacers 90 may extend beyond or be recessed from sidewalls of the second nanostructures 54.

Figure 11B:
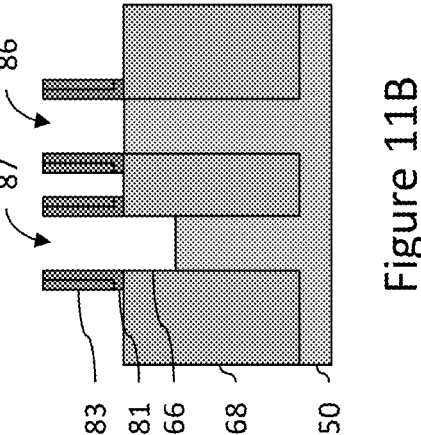
Figure 11A:
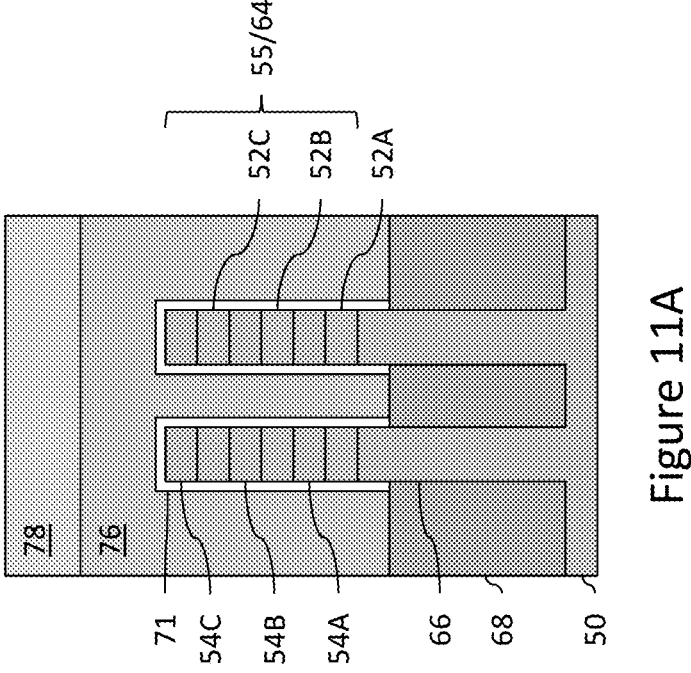
Figure 11C:
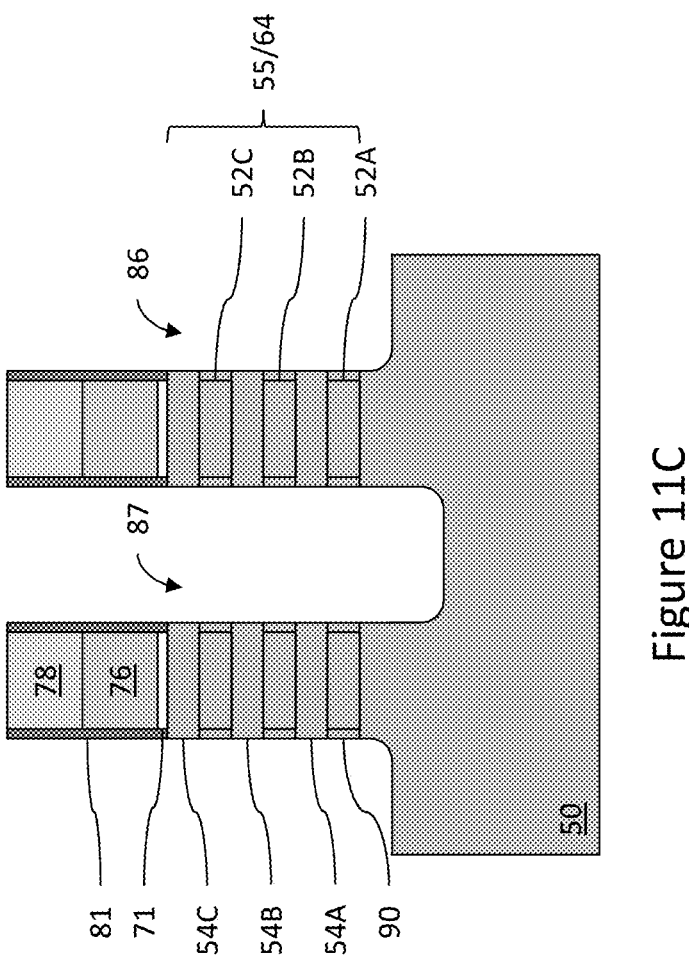
Figure 11D:
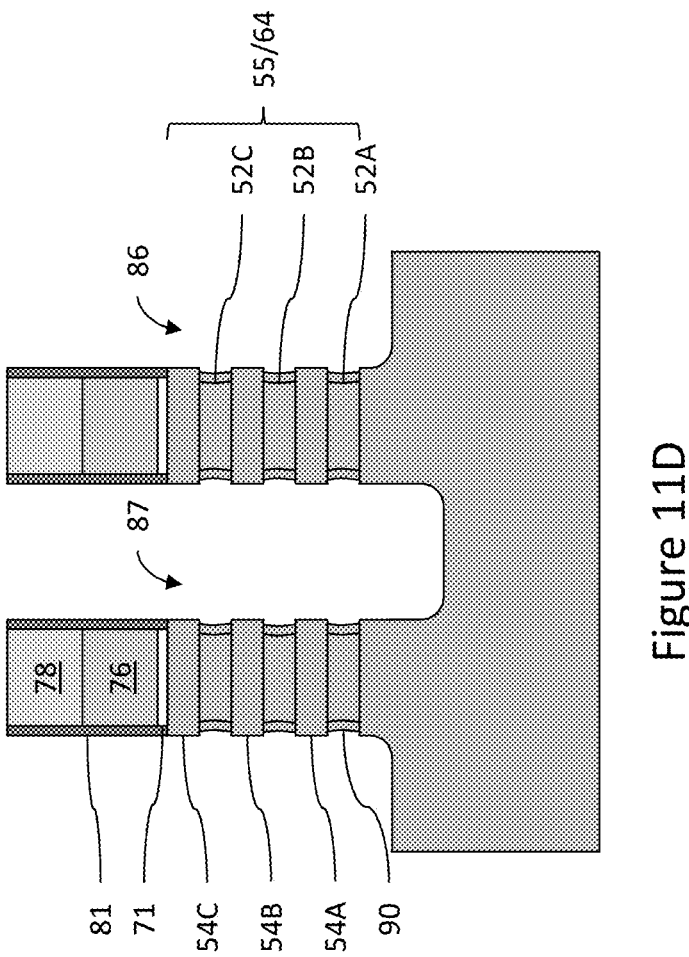

Moreover, although the outer sidewalls of the first inner spacers 90 are illustrated as being straight in FIG. 11C, the outer sidewalls of the first inner spacers 90 may be concave or convex. As an example, FIG. 11D illustrates an embodiment in which sidewalls of the first nanostructures 52 are concave, outer sidewalls of the first inner spacers 90 are concave, and the first inner spacers 90 are recessed from sidewalls of the second nanostructures 54. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A through 12E) by subsequent etching processes, such as etching processes used to form gate structures.

In FIGS. 12A through 12E, first epitaxial materials 91 are formed in the second recesses 87 and epitaxial source/drain regions 92 are formed in the first recesses 86 and the second recesses 87. In some embodiments, the first epitaxial materials 91 may be sacrificial materials, which are subsequently removed to form back-side vias (such as the back-side vias 130, discussed below with respect to FIGS. 26A through 26D). As illustrated in FIGS. 12B through 12E, top surfaces of the first epitaxial materials 91 may be level with bottom surfaces of the first recesses 86. However, in some embodiments, top surfaces of the first epitaxial materials 91 may be disposed above or below bottom surfaces of the first recesses 86. The first epitaxial materials 91 may be epitaxially grown in the second recesses 87 using a process such as CVD, ALD, VPE, MBE, or the like. The first epitaxial materials 91 may include any acceptable material, such as silicon germanium or the like. The first epitaxial materials 91 may be formed of materials having high etch selectivity to materials of the epitaxial source/drain regions 92, the substrate 50, and dielectric layers (such as the STI regions 68 and second dielectric layers 125, discussed below with respect to FIGS. 24A through 24C). As such, the first epitaxial materials 91 may be removed and replaced with the back-side vias without significantly removing the epitaxial source/drain regions 92 and the dielectric layers. In the embodiments where the first epitaxial materials 91 and the epitaxial source/drain regions 92 each comprise silicon germanium, a germanium percentage of the first epitaxial materials 91 may be different than a germanium percentage of the epitaxial source/drain region so that etching selectivity may be achieved. The first epitaxial materials 91 may be selectively grown in the first recesses 86 by masking the second recesses 87 while the first epitaxial materials 91 are grown, for example.

Figure 12B:
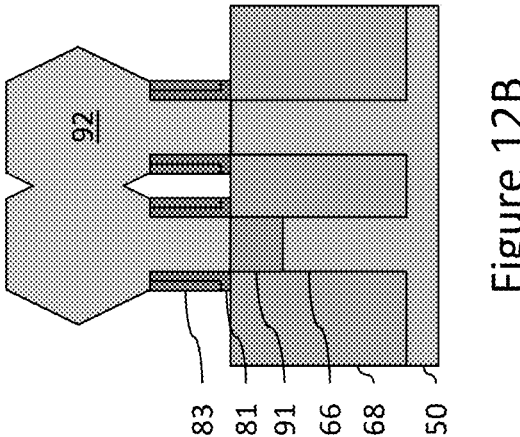

The epitaxial source/drain regions 92 are then formed in the first recesses 86 and over the first epitaxial materials 91 in the second recesses 87. In some embodiments, the epitaxial source/drain regions 92 may exert stress on the second nanostructures 54, thereby improving performance. As illustrated in FIG. 12C, the epitaxial source/drain regions 92 are formed in the first recesses 86 and the second recesses 87 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 and the second recesses 87 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 and the second recesses 87 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 56 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 12B. In other embodiments, adjacent epitaxial source/drain regions 92 remain separated after the epitaxy process is completed as illustrated by FIG. 12D. In the embodiments illustrated in FIGS. 12B and 12D, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In the embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12A:
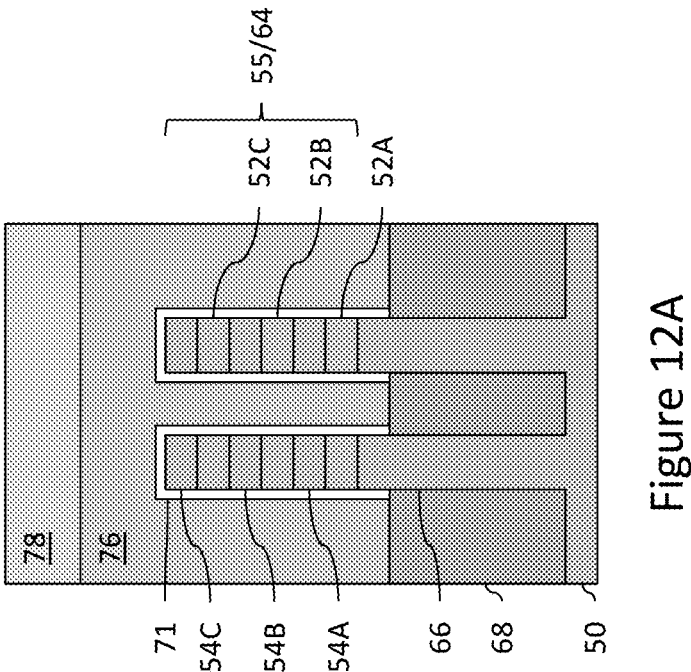
Figure 12D:
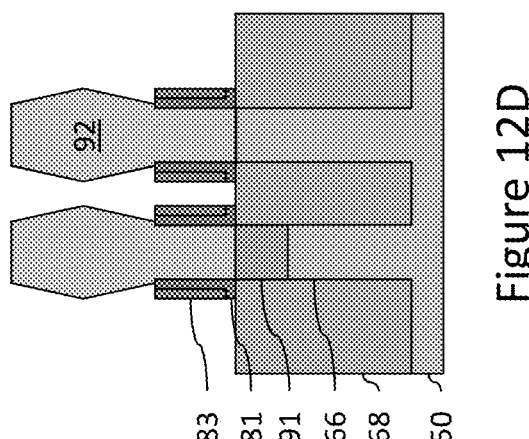
Figure 12C:
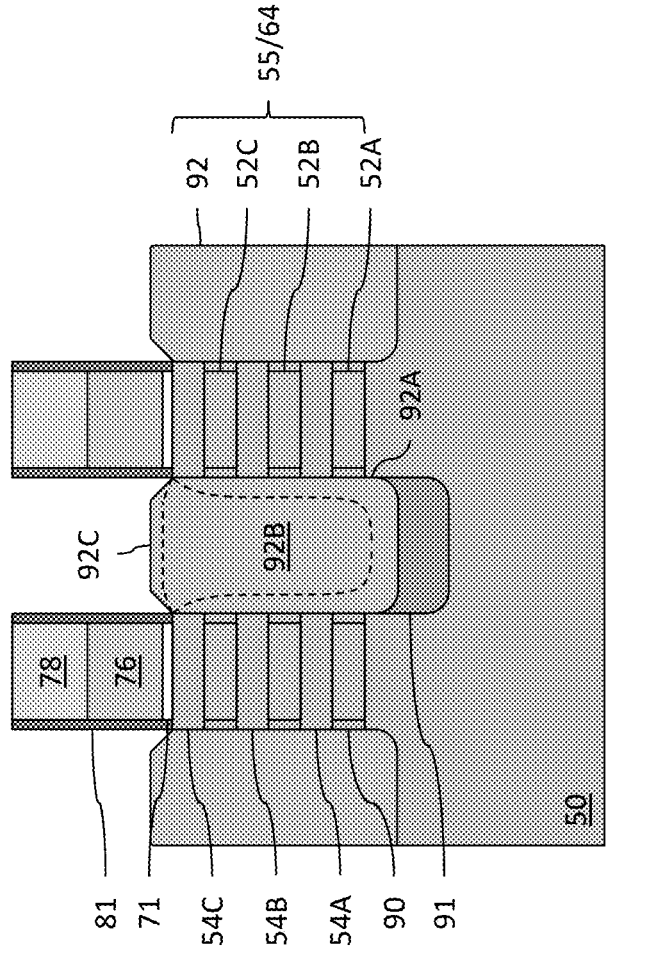
Figure 12E:
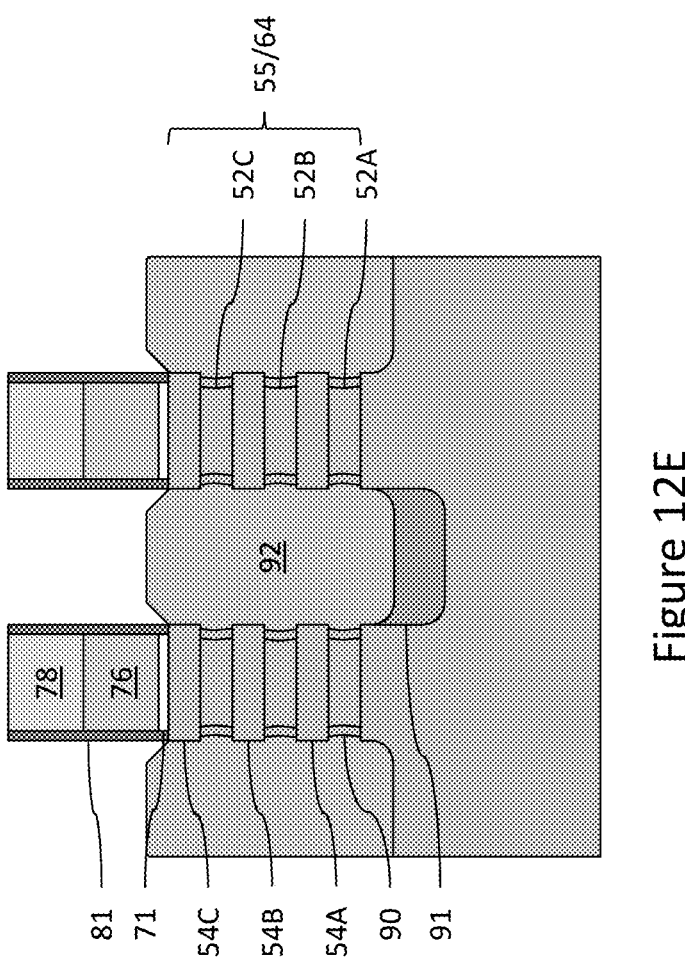

FIG. 12E illustrates an embodiment in which sidewalls of the first nanostructures 52 are concave, outer sidewalls of the first inner spacers 90 are concave, and the first inner spacers 90 are recessed from sidewalls of the second nanostructures 54. As illustrated in FIG. 12E, the epitaxial source/drain regions 92 may be formed in contact with the first inner spacers 90 and may extend past sidewalls of the second nanostructures 54.

Figure 13B:
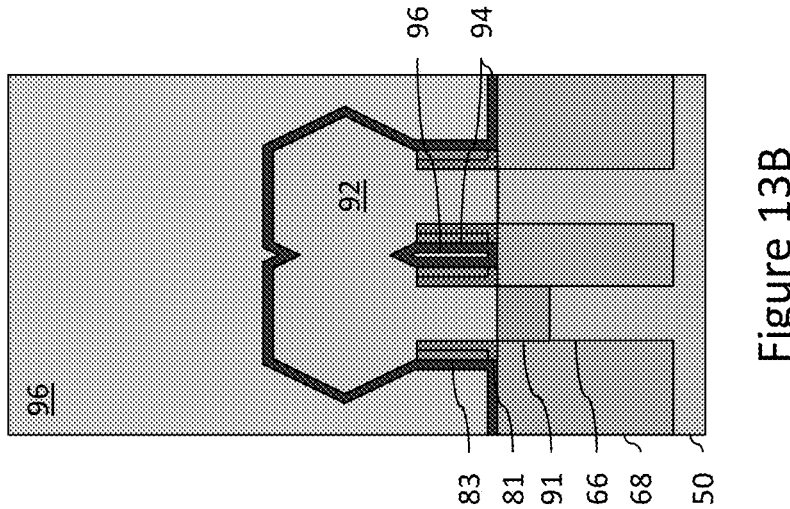
Figure 13A:
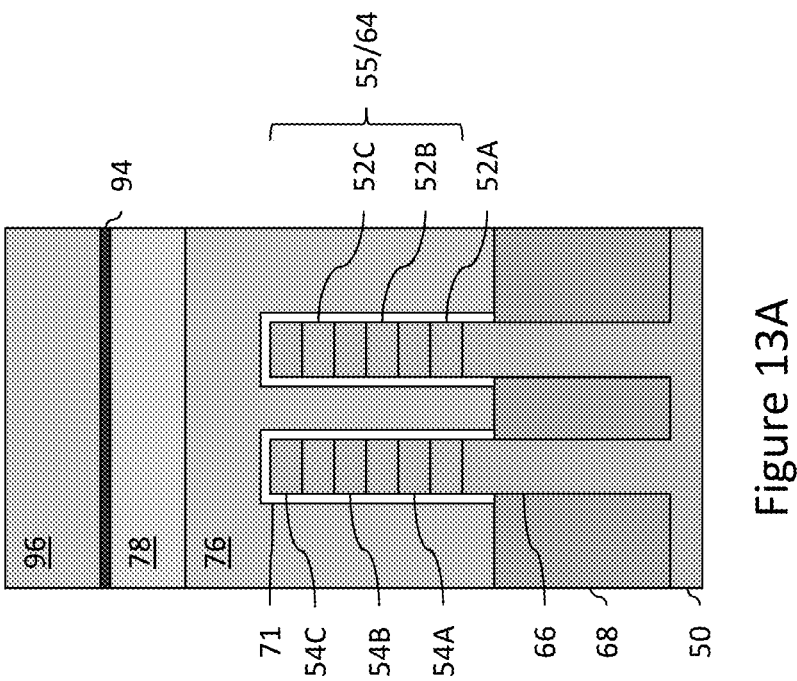
Figure 13C:
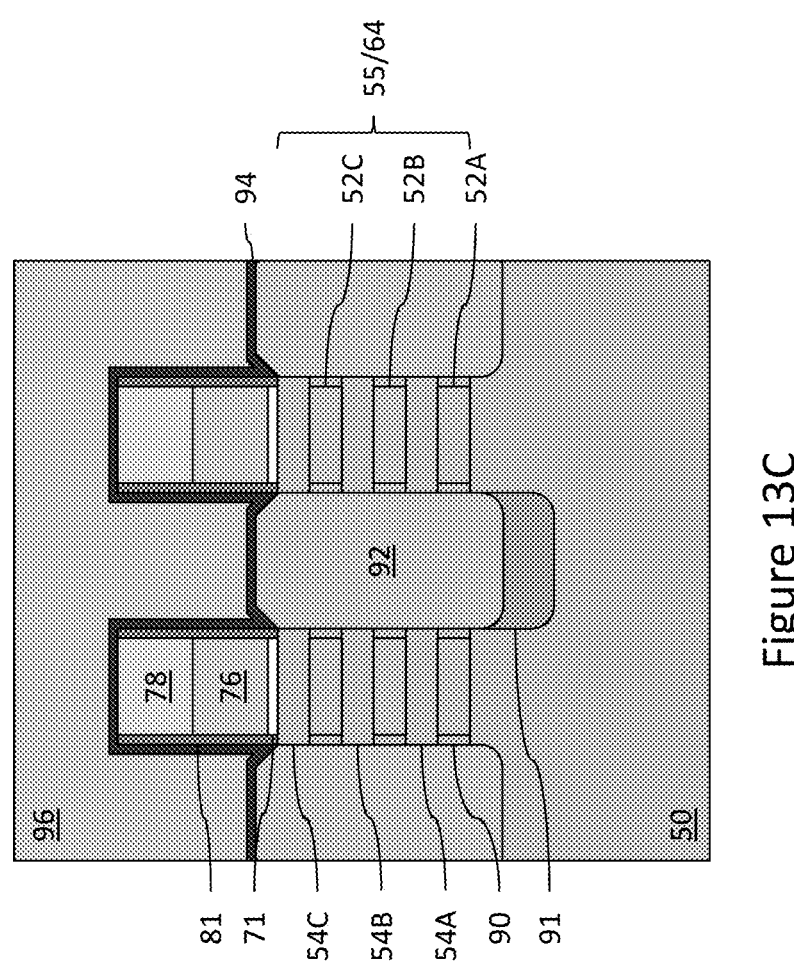

In FIGS. 13A through 13C, a first interlayer dielectric (ILD) 96 is deposited over the structure illustrated in FIGS. 12A through 12C. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 14B:
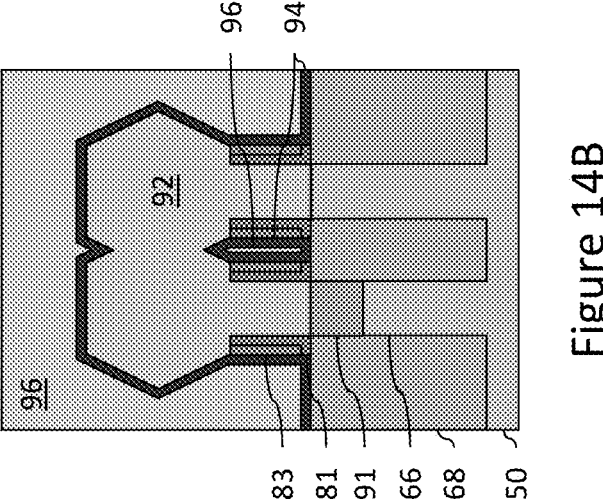
Figure 14A:
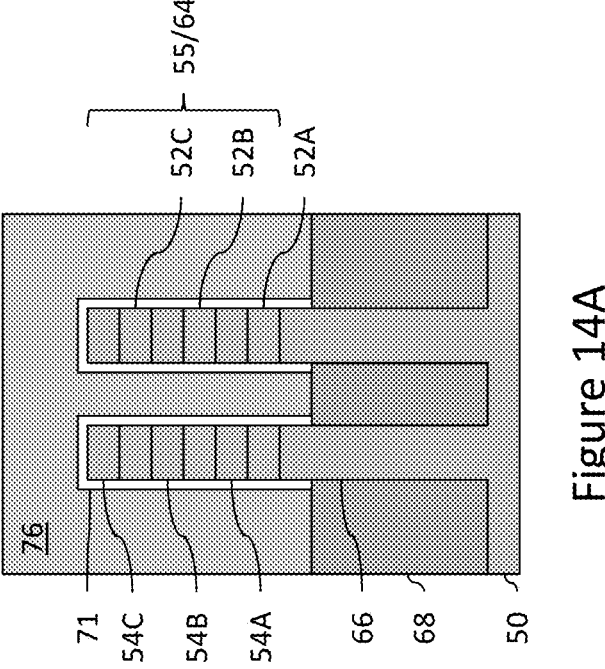
Figure 14C:
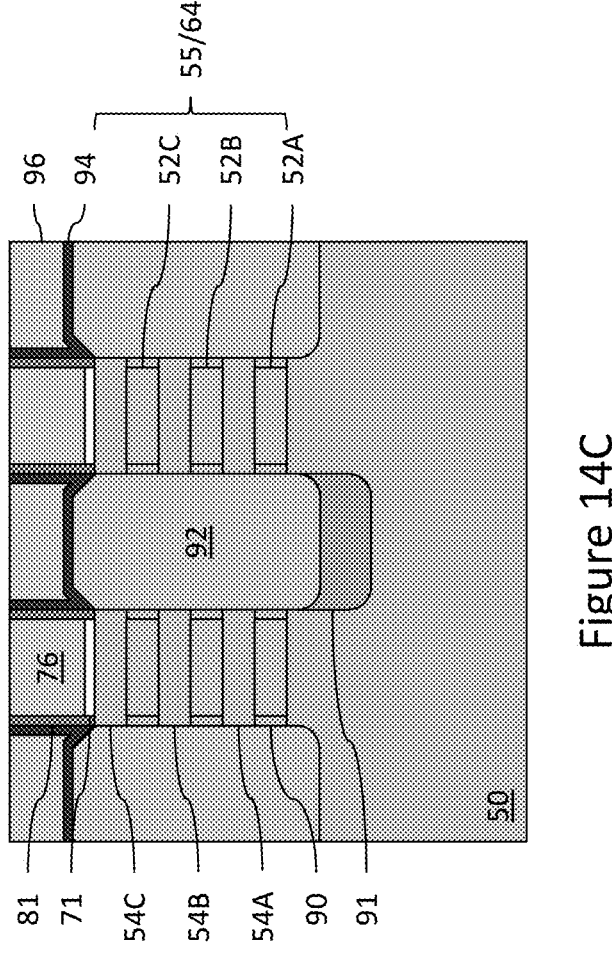

In FIGS. 14A through 14C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 15B:
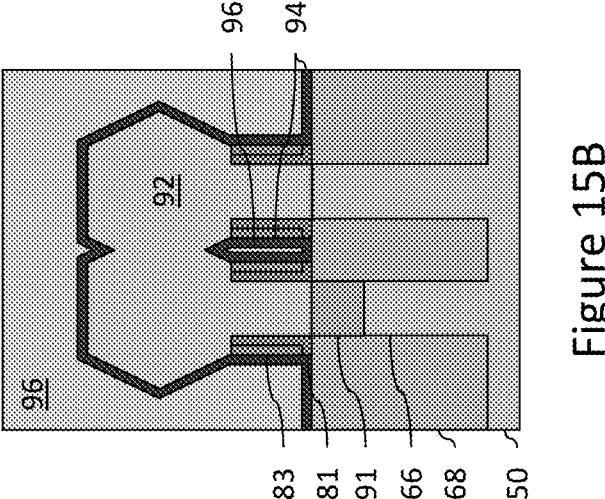
Figure 15A:
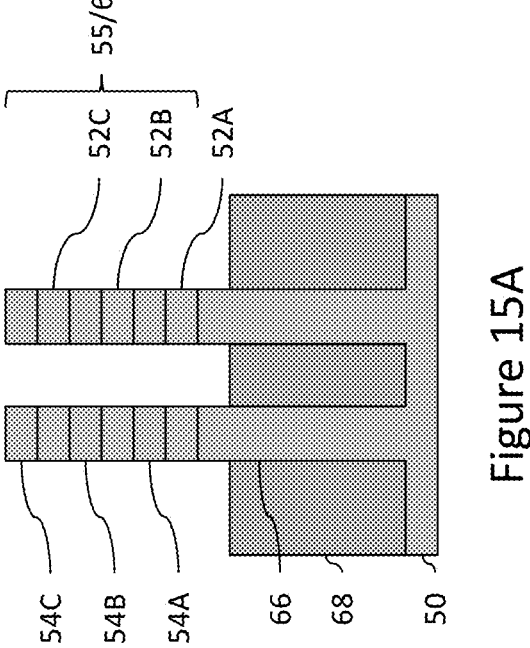
Figure 15C:
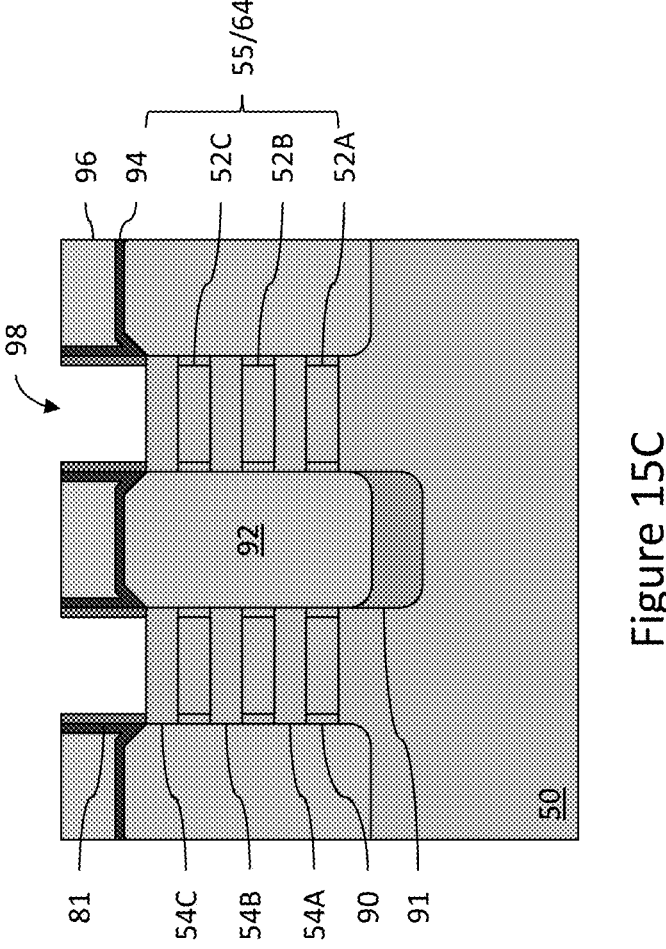

In FIGS. 15A through 15C, the dummy gates 76, and the masks 78 if present, are removed in one or more etching steps, so that third recesses 98 are formed. Portions of the dummy gate dielectrics 60 in the third recesses 98 are also be removed. In some embodiments, the dummy gates 76 and the dummy gate dielectrics 60 are removed by an anisotropic dry etch process. For example, the etching process may include a dry etch process using reaction gas(es) that selectively etch the dummy gates 76 at a faster rate than the first ILD 96 or the first spacers 81. Each of the third recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy gate dielectrics 60 may be used as etch stop layers when the dummy gates 76 are etched. The dummy gate dielectrics 60 may then be removed after the removal of the dummy gates 76.

Figure 16B:
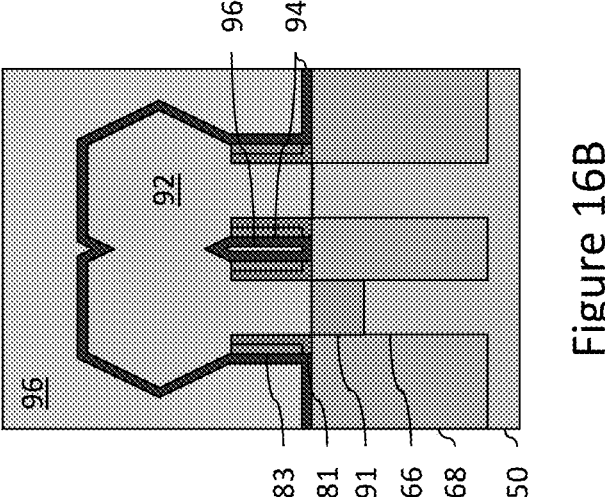
Figure 16A:
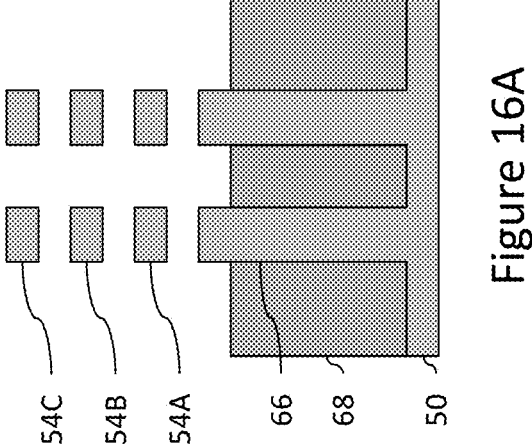
Figure 16C:
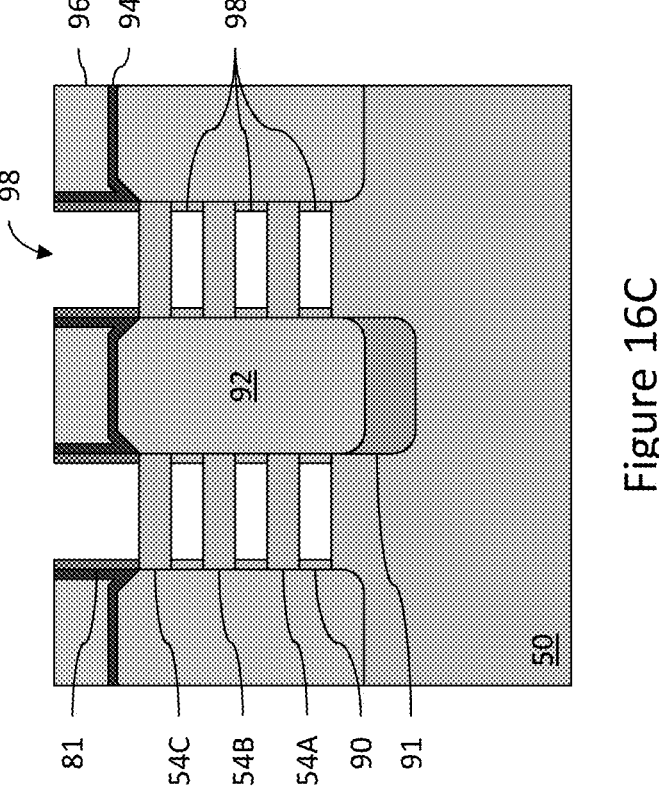

In FIGS. 16A through 16C, the first nanostructures 52 are removed extending the third recesses 98. The first nanostructures 52 may be removed by performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In the embodiments in which the first nanostructures 52 include, e.g., SiGe, and the second nanostructures 54A-54C include, e.g., Si or SiC, tetramethylammonium hydroxide (TMAH), ammonium hydroxide (NH4OH), or the like may be used to remove the first nanostructures 52.

Figure 17B:
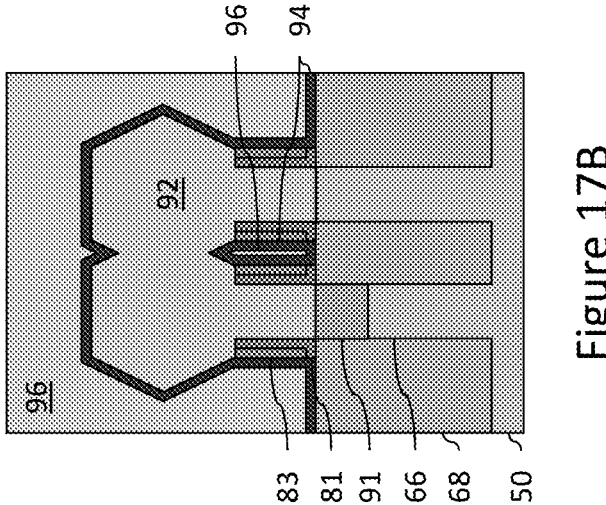
Figure 17A:
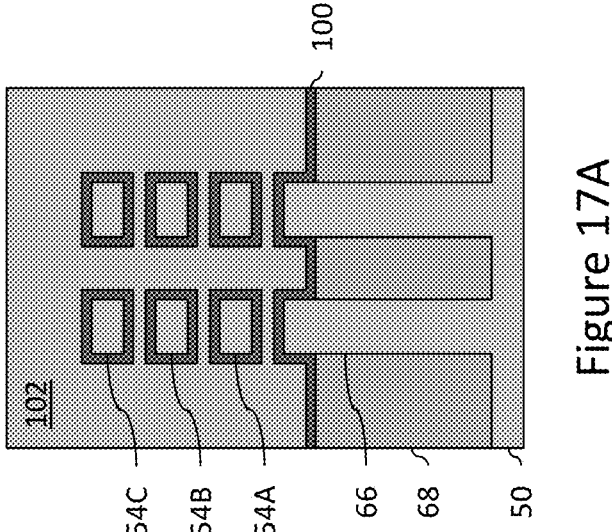
Figure 17C:
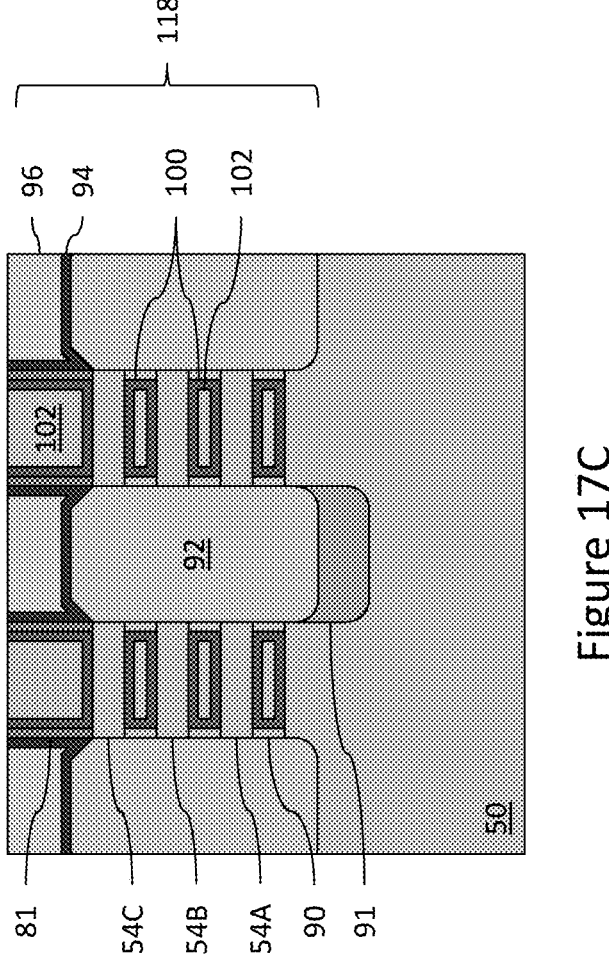

In FIGS. 17A through 17C, gate dielectric layers 100 and gate electrodes 102 are formed for replacement gates. The gate dielectric layers 100 are deposited conformally in the third recesses 98. The gate dielectric layers 100 may be formed on top surfaces and sidewalls of the substrate 50 and on top surfaces, sidewalls, and bottom surfaces of the second nanostructures 54. The gate dielectric layers 100 may also be deposited on top surfaces of the first ILD 96, the CESL 94, the first spacers 81, and the STI regions 68 and on sidewalls of the first spacers 81 and the first inner spacers 90.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a dielectric constant (k) value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the third recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 17A and 17C, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the third recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 18B:
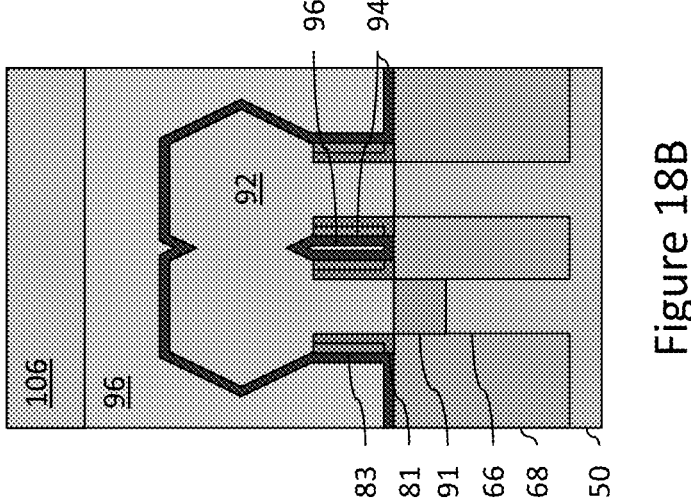
Figure 18A:
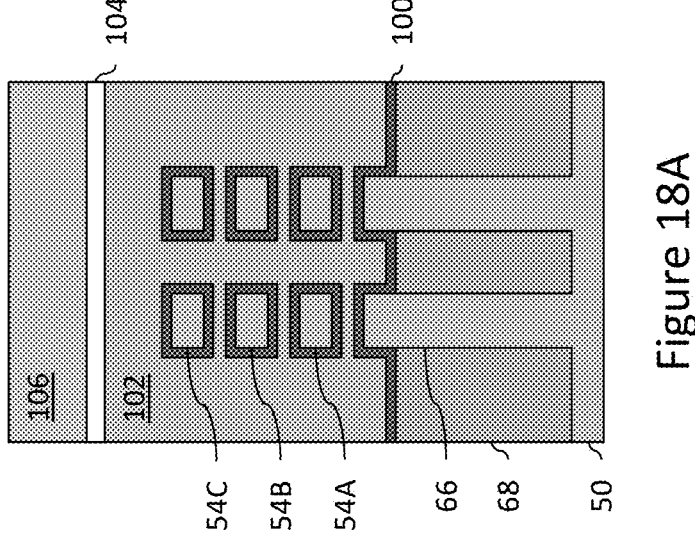
Figure 18C:
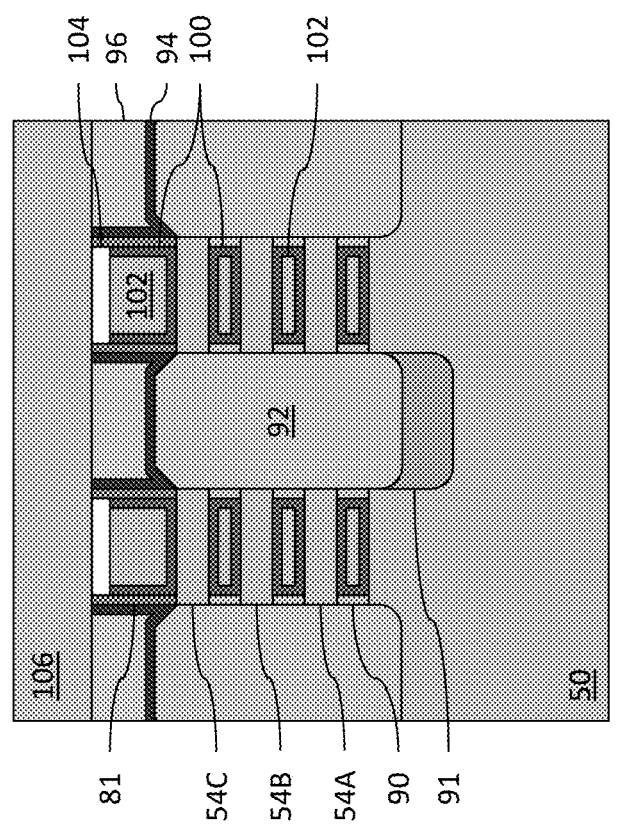

In FIGS. 18A through 18C, the gate structures (including the gate dielectric layers 100 and the corresponding overlying gate electrodes 102) are recessed, so that recess are formed directly over the gate structures and between opposing portions of first spacers 81. Gate masks 104 comprising one or more layers of dielectric material, such as silicon nitride, silicon oxynitride, or the like, are filled in the recesses, followed by a planarization process to remove excess portions of the dielectric material extending over the first ILD 96. Subsequently formed gate contacts (such as the gate contacts 114, discussed below with respect to FIGS. 20A through 20C) penetrate through the gate masks 104 to contact the top surfaces of the recessed gate electrodes 102.

As further illustrated by FIGS. 18A through 18C, a second ILD 106 is deposited over the first ILD 96 and over the gate masks 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 19B:
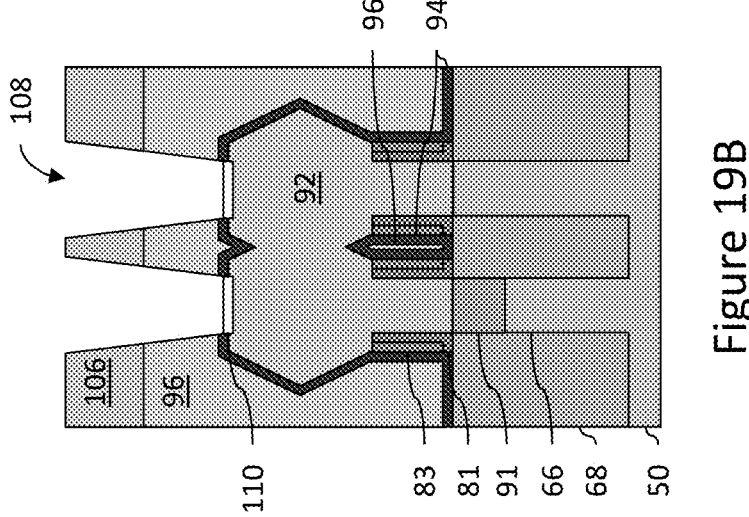
Figure 19A:
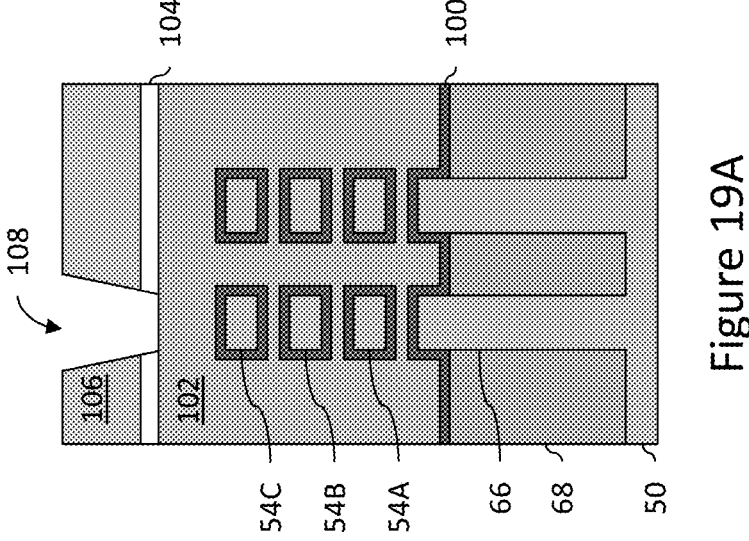
Figure 19C:
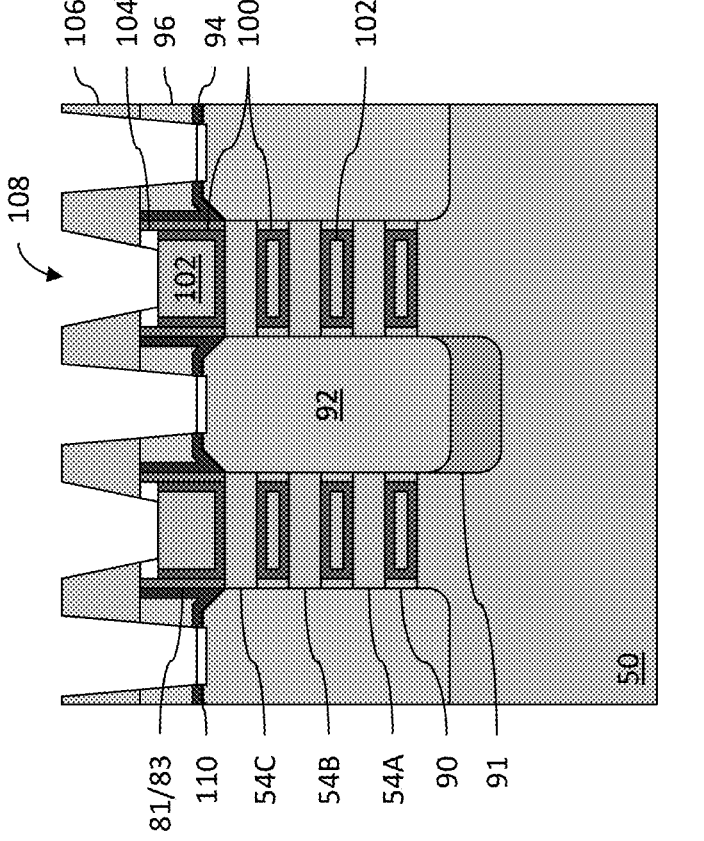

In FIGS. 19A through 19C, the second ILD 106, the first ILD 96, the CESL 94, and the gate masks 104 are etched to form fourth recesses 108 exposing surfaces of the epitaxial source/drain regions 92 and/or the gate structures. The fourth recesses 108 may be formed by etching using an anisotropic etching process, such as RIE, NBE, or the like. In some embodiments, the fourth recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the fourth recesses 108 extend into the epitaxial source/drain regions 92 and/or the gate structures, and a bottom of the fourth recesses 108 may be level with (e.g., at a same level, or having a same distance from the substrate 50), or lower than (e.g., closer to the substrate 50) the epitaxial source/drain regions 92 and/or the gate structures. Although FIG. 19C illustrates the fourth recesses 108 as exposing the epitaxial source/drain regions 92 and the gate structures in a same cross-section, in various embodiments, the epitaxial source/drain regions 92 and the gate structures may be exposed in different cross-sections, thereby reducing the risk of shorting subsequently formed contacts.

After the fourth recesses 108 are formed, first silicide regions 110 are formed over the epitaxial source/drain regions 92. In some embodiments, the first silicide regions 110 are formed by first depositing a metal (not separately illustrated) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the first silicide regions 110. The un-reacted portions of the deposited metal are then removed, e.g., by an etching process. Although the first silicide regions 110 are referred to as silicide regions, the first silicide regions 110 may also be germanide regions, or silicon germanide regions (e.g., regions comprising silicide and germanide).

Figure 20B:
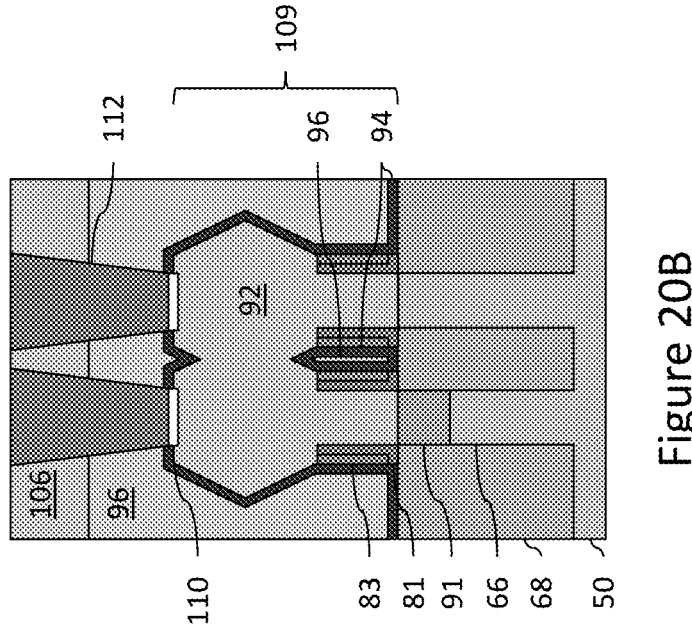
Figure 20A:
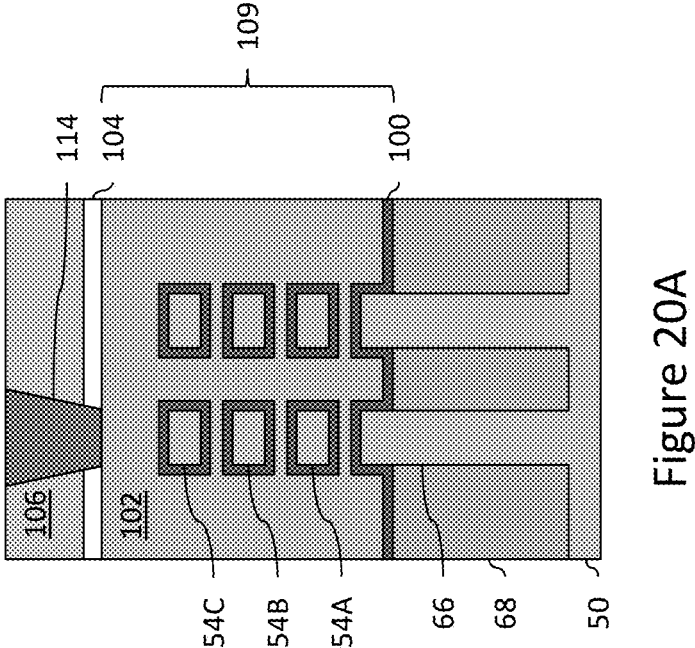
Figure 20C:
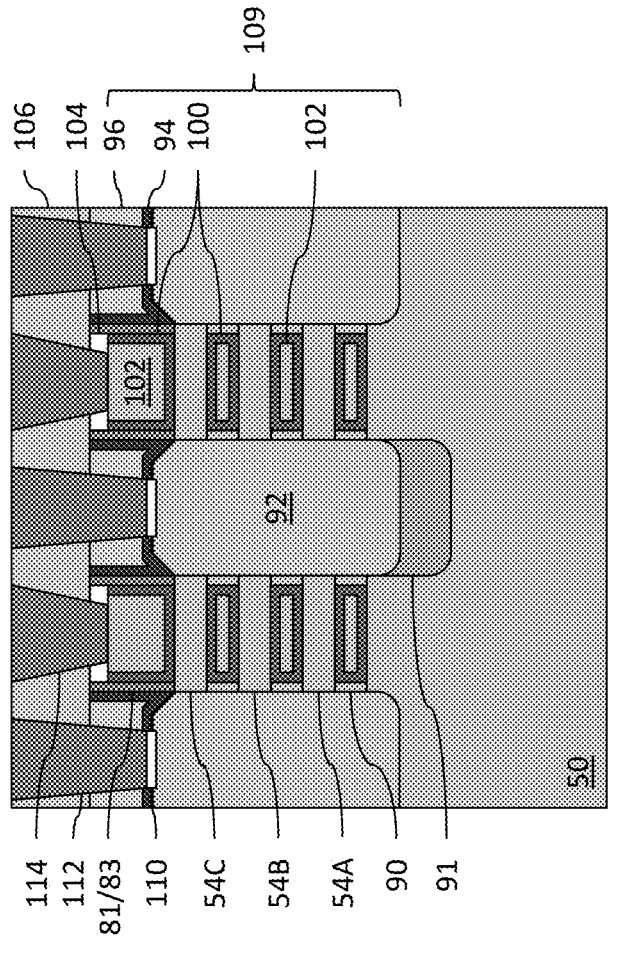

In FIGS. 20A through 20C, source/drain contacts 112 and gate contacts 114 (also referred to as contact plugs) are formed in the fourth recesses 108. The source/drain contacts 112 and the gate contacts 114 may each comprise one or more layers, such as barrier layers, diffusion layers, and fill materials. For example, in some embodiments, the source/drain contacts 112 and the gate contacts 114 each include a barrier layer and a conductive material, and are each electrically coupled to an underlying conductive feature (e.g., a gate electrode 102 and/or a first silicide region 110). The gate contacts 114 are electrically coupled to the gate electrodes 102 and the source/drain contacts 112 are electrically coupled to the first silicide regions 110. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from surfaces of the second ILD 106. The epitaxial source/drain regions 92, the second nanostructures 54 (e.g., channel regions), and the gate structures (including the gate dielectric layers 100 and the gate electrodes 102) may collectively be referred to as transistor structures 109. The transistor structures 109 may be collectively disposed in a device layer, with a first interconnect structure (such as the front-side interconnect structure 120, discussed below with respect to FIGS. 21A through 21C) being formed over a front-side thereof and a second interconnect structure (such as the back-side interconnect structure 136, discussed below with respect to FIGS. 27A through 28C) being formed over a back-side thereof. Although the device layer is described as having nano-FETs, other embodiments may include a device layer having different types of transistors (e.g., planar FETs, finFETs, thin film transistors (TFTs), or the like).

Although FIGS. 20A through 20C illustrate a source/drain contact 112 extending to each of the epitaxial source/drain regions 92, the source/drain contacts 112 may be omitted from certain ones of the epitaxial source/drain regions 92. For example, as explained in greater detail below, conductive features (e.g., back-side vias or power rails) may be subsequently attached through a back-side of one or more of the epitaxial source/drain regions 92. For these particular epitaxial source/drain regions 92, the source/drain contacts 112 may be omitted or may be dummy contacts that are not electrically connected to any overlying conductive lines (such as the first conductive features 122, discussed below with respect to FIGS. 21A through 21C).

FIGS. 21A through 28C illustrate intermediate steps of forming front-side interconnect structures and back-side interconnect structures on the transistor structures 109. The front-side interconnect structures and the back-side interconnect structures may each comprise conductive features that are electrically connected to the nano-FETs formed on the substrate 50 to provide functional circuits. The process steps described in FIGS. 21A through 28C may be applied to both the n-type region 50N and the p-type region 50P. As noted above, a back-side conductive feature (e.g., a back-side via or a power rail) may be connected to one or more of the epitaxial source/drain regions 92. As such, the source/drain contacts 112 may be optionally omitted from these epitaxial source/drain regions 92.

In FIGS. 21A through 21D, a front-side interconnect structure 120 is formed on the second ILD 106. The front-side interconnect structure 120 may be referred to as a front-side interconnect structure because it is formed on a front-side of the transistor structures 109 (e.g., a side of the transistor structures 109 on which active devices are formed).

The front-side interconnect structure 120 may comprise one or more layers of first conductive features 122 formed in one or more stacked first dielectric layers 124. Each of the stacked first dielectric layers 124 may comprise a dielectric material, such as a low-k dielectric material, an extra low-k (ELK) dielectric material, or the like. The first dielectric layers 124 may be deposited using an appropriate process, such as, CVD, ALD, PVD, PECVD, or the like.

The first conductive features 122 may comprise conductive lines and conductive vias interconnecting the layers of conductive lines. The conductive vias may extend through respective ones of the first dielectric layers 124 to provide vertical connections between layers of the conductive lines. The first conductive features 122 may be formed through any acceptable process, such as, a damascene process, a dual damascene process, or the like.

In some embodiments, the first conductive features 122 may be formed using a damascene process in which a respective first dielectric layer 124 is patterned utilizing a combination of photolithography and etching techniques to form trenches corresponding to the desired pattern of the first conductive features 122. An optional diffusion barrier and/or optional adhesion layer may be deposited, and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the first conductive features 122 may be formed by depositing a seed layer of copper or a copper alloy, and filling the trenches by electroplating. A chemical mechanical planarization (CMP) process or the like may be used to remove excess conductive material from a surface of the respective first dielectric layer 124 and to planarize surfaces of the first dielectric layer 124 and the first conductive features 122 for subsequent processing.

Figures 21A, 21B:
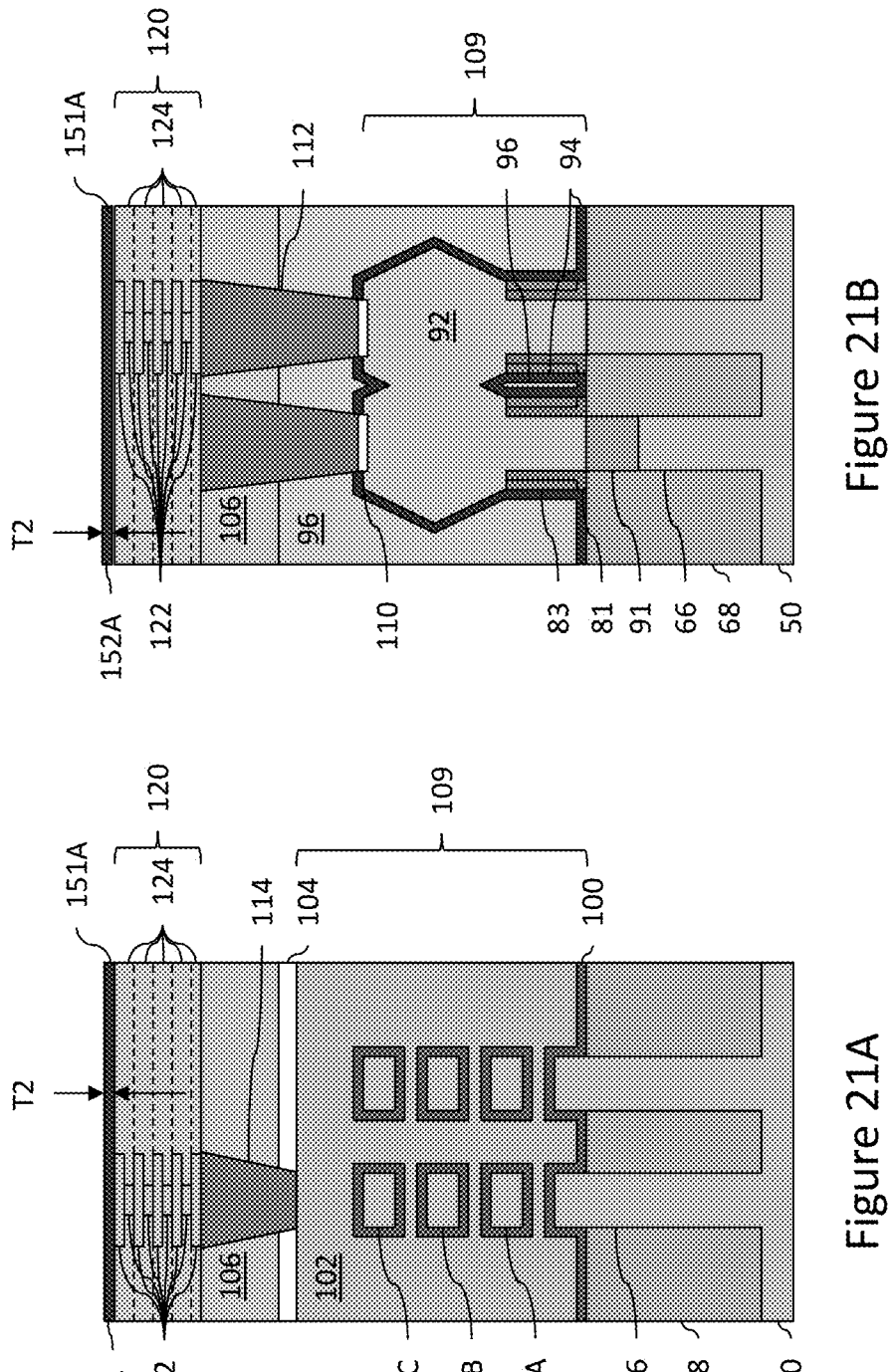
Figure 21C:
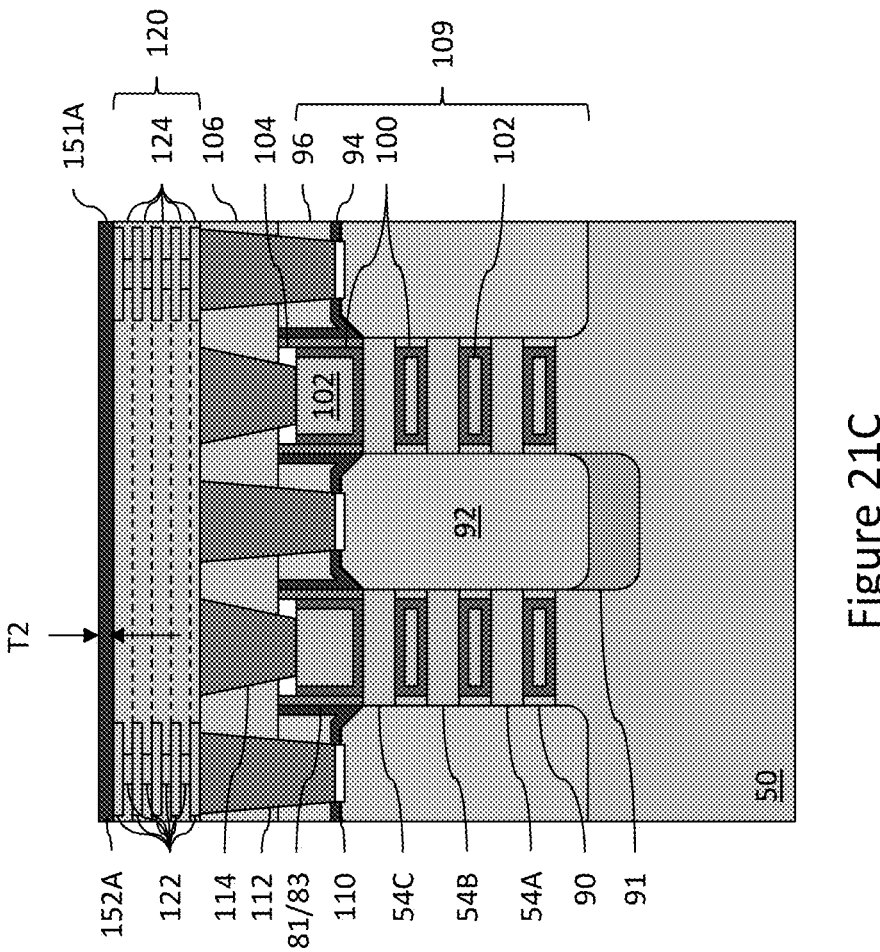

FIGS. 21A through 21C illustrate five layers of the first conductive features 122 and the first dielectric layers 124 in the front-side interconnect structure 120. However, it should be appreciated that the front-side interconnect structure 120 may comprise any number of first conductive features 122 disposed in any number of first dielectric layers 124. The front-side interconnect structure 120 may be electrically connected to the gate contacts 114 and the source/drain contacts 112 to form functional circuits. In some embodiments, the functional circuits formed by the front-side interconnect structure 120 may comprise logic circuits, memory circuits, image sensor circuits, or the like.

As also illustrated in FIGS. 21A through 21D, a first bonding layer 152A may be deposited over the front-side interconnect structure 120. The first bonding layer 152A may be also referred to as the first material layer 152A. The first bonding layer 152A may facilitate the bonding of a carrier substrate in subsequent processes (see FIGS. 22A through 22C) and transfer the heat generated by transistor structures 109 to the carrier substrate during operation as discussed in greater detail below. The first bonding layer 152A may be a composite material and comprise a first base layer 151A and first nano-particles 153A (shown in FIG. 21D) embedded in the first base layer 151A. The first base layer 151A may comprise a material suitable for a subsequent dielectric-to-dielectric bonding process and may have a high thermal conductivity, such as a metal oxide. The first base layer 151A may have a thermal conductivity larger than about 4 W/m·K. Example materials for the first base layer 151A may include titanium oxide, aluminum oxide, nickel oxide, zinc oxide, or the like.

Figure 21D:
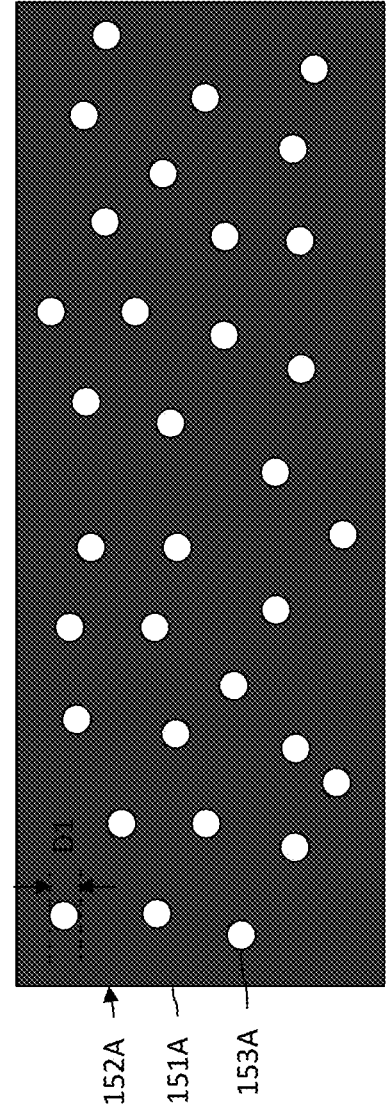

FIG. 21D shows a representative portion of the first bonding layer 152A. The first nano-particles 153A may comprise a material with a high thermal conductivity, such as a metal which may be larger than the thermal conductivity of the first base layer 151A. The first nano-particles 153A may have a thermal conductivity larger than about 100 W/m·K. As a result, the first nano-particles 153A may improve the thermal conductivity of the first bonding layer 152A. The first nano-particles 153A may have a spherical shape and may be evenly dispersed in the first base layer 151A. Example materials for the first nano-particles 153A may include silver, ruthenium, niobium, or the like. In some embodiments, the first nano-particles 153A may have a diameter D1 in a range of about 3 nm to about 10 nm. In some embodiments, the concentration of the first nano-particles 153A in the first bonding layer 152A may be in a range of about 0.1 wt. % to about 10 wt. %. Such a concentration range may lead to sufficiently improved thermal conductivity of the first bonding layer 152A while maintaining the mechanical properties of the first bonding layer 152A.

The first bonding layer 152A may be deposited by any suitable method, such as PVD, CVD, ALD, or the like. As an example of forming the first bonding layer 152A, a PECVD process may be used to deposit the first base layer 151A with the first nano-particles 153A embedded in the first base layer 151A. The deposition process may follow a sequence comprising a number of repeating cycles. Each cycle may comprise a first step of flowing first precursors for depositing the first base layer 151A and a second step of flowing second precursors for depositing the first nano-particles 153A. As a result, during the forming the first bonding layer 152A, the first base layer 151A and the first nano-particles 153A may be deposited in an alternating sequence. In the embodiments where the first base layer 151A comprises titanium oxide, titanium tetrachloride, titanium tetraisopropoxide, titanium isopropoxide, or titanium acetylacetonate may be used as the first precursors for the first base layer 151A. In the embodiments where the first base layer 151A comprises aluminum oxide, trimethylaluminum (TMA), triethylaluminum (TEA), or aluminum trichloride may be used as the first precursors for the first base layer 151A. In the embodiments where the first base layer 151A comprises nickel oxide, nickelocene, nickel acetylacetonate, or nickel nitrate may be used as the first precursors for the first base layer 151A. In the embodiments where the first base layer 151A comprises zinc oxide, diethylzinc (DEZ), dimethylzinc (DMZ), or zinc acetate may be used as the first precursors for the first base layer 151A. In the embodiments where the first nano-particles 153A comprise silver, silver nitrate, silver acetylacetonate, silver oxide, or silver hexafluoroacetylacetonate may be used as the second precursors for the first nano-particles 153A. In the embodiments where the first nano-particles 153A comprise ruthenium, ruthenium trichloride, ruthenium tetroxide, bis(cyclopentadienyl)ruthenium, or ruthenium carbonyl may be used as the second precursors for the first nano-particles 153A. In the embodiments where the first nano-particles 153A comprise niobium, niobium pentachloride, niobium ethoxide, niobium pentabutoxide, or niobium pentafluoride may be used as the second precursors for the first nano-particles 153A. The first base layer 151A may be amorphous and the first nano-particles 153A may be crystalline after the deposition process. The deposition may be performed at a temperature smaller than 250° C., which may prevent the first base layer 151A from transitioning from an amorphous structure to a crystalline structure. An amorphous first base layer 151A may be softer than a crystalline first base layer 151A and may lead to an effective subsequent planarization process.

Then a planarization process, such as CMP or the like, may be used to remove excess material from a surface of the first bonding layer 152A and to planarize the surface of the first bonding layer 152A for subsequent processing. After the planarization process, a roughness of the surface of the first bonding layer 152A may be smaller than about 1 nm and a height difference between a highest point of and a lowest point of the surface of the first bonding layer 152A may be smaller than about 30 nm. In some embodiments, a thickness T2 of the first bonding layer 152A may be greater than 20 nm, such as in a range of about 20 nm to about 200 nm. The thickness T2 being greater than 20 nm may lead to an effective subsequent bonding process of the first bonding layer 152A as well as sufficient heat transfer capability of the first bonding layer 152A.

In FIGS. 22A through 22E, a carrier substrate 150 is bonded to the front-side interconnect structure 120 by bonding the first bonding layer 152A and a second bonding layer 152B on the carrier substrate 150. The carrier substrate 150 may be also referred to as the substrate 150 and the second bonding layer 152B may be also referred to as the second material layer 152B. After bonding with the first bonding layer 152A, the second bonding layer 152B may also transfer heat generated by transistor structures 109 during operation to the carrier substrate 150 as discussed in greater detail below.

The carrier substrate 150 may be a glass carrier substrate, a ceramic carrier substrate, a wafer (e.g., a silicon wafer), or the like. The carrier substrate 150 may provide structural support during subsequent processes and in the completed device. The second bonding layer 152B may be a composite material and comprise a second base layer 151B and second nano-particles 153B embedded in the second base layer 151B, which is similar to the first bonding layer 152A as shown in FIG. 21D. The second base layer 151B may comprise a material suitable for a dielectric-to-dielectric bonding process and may have a high thermal conductivity, such as a metal oxide. The second base layer 151B may have a thermal conductivity larger than about 4 W/m·K. Example materials for the second base layer 151B may include titanium oxide, aluminum oxide, nickel oxide, zinc oxide, or the like. In some embodiments, the first base layer 151A and the second base layer 151B may comprise a same material.

The second nano-particles 153B may comprise a material with a high thermal conductivity, such as a metal, which may be larger than the thermal conductivity of the second base layer 151B. The second nano-particles 153B may have a thermal conductivity larger than about 100 W/m·K. As a result, the second nano-particles 153B may improve the thermal conductivity of the second bonding layer 152B. The second nano-particles 153B may have a spherical shape and may be evenly dispersed in the second base layer 151B. Example materials for the second nano-particles 153B may include silver, ruthenium, niobium, or the like. In some embodiments, the first nano-particles 153A and the second nano-particles 153B may comprise a same material. In some embodiments, the first nano-particles 153A and the second nano-particles 153B may comprise different materials. In some embodiments, the second nano-particles 153B may have a diameter D2 in a range of about 3 nm to about 10 nm. In some embodiments, the concentration of the second nano-particles 153B in the second bonding layer 152B may be in a range of about 0.1 wt. % to about 10 wt. %. Such a concentration range may lead to sufficiently improved thermal conductivity of the second bonding layer 152B while maintaining the mechanical properties of the second bonding layer 152B.

The second bonding layer 152B may be deposited by a similar method as described with respect to the first bonding layer 152A. The second base layer 151B may be amorphous and the second nano-particles 153B may be crystalline after the deposition process. Then, a planarization process, such as CMP or the like, may be used to remove excess material from a surface of the second bonding layer 152B and to planarize the surface of the second bonding layer 152B for subsequent processing. After the planarization process, a roughness of the surface of the second bonding layer 152B may be smaller than about 1 nm and a height difference between a highest point of and a lowest point of the surface of the second bonding layer 152B may be smaller than about 30 nm. In some embodiments, a thickness T4 of the second bonding layer 152B may be greater than 20 nm, such as in a range of about 20 nm to about 200 nm. The thickness T4 being greater than 20 nm may lead to an effective subsequent bonding process of the bonding layer 152B as well as sufficient heat transfer capability of the second bonding layer 152B. In some embodiments, the thickness T4 of the second bonding layer 152B may be the same as or different from the thickness T2 of the first bonding layer 152A.

The carrier substrate 150 may be bonded to the front-side interconnect structure 120 by bonding the first bonding layer 152A and the second bonding layer 152B using any suitable method, such as dielectric-to-dielectric bonding, or the like. FIG. 22D illustrates an example of the dielectric-to-dielectric bonding process between the first bonding layer 152A and the second bonding layer 152B, wherein the first base layer 151A and the second base layer 151B comprise titanium oxide. Other embodiments may be achieved by replacing titanium with another metal element. Initially, in step 250 of FIG. 22D, the first bonding layer 152A and the second bonding layer 152B are provided. FIG. 22D illustrates a detailed schematic of a portion of the first bonding layer 152A and the bonding layer 152B, where only the materials of the first base layer 151A and the second base layer 151B are shown for simplicity.

The dielectric-to-dielectric bonding process continues with step 252 of applying a surface treatment to the first bonding layer 152A and/or the second bonding layer 152B. The surface treatment may break bonds between one or more titanium atoms and one or more oxygen atoms, and form hydroxyl groups (—OH groups) bonded to the one or more titanium atoms on the surfaces of the first bonding layer 152A and the second bonding layer 152B. The hydroxyl groups may be bonded to water molecules by hydrogen bonds. In some embodiments, the surface treatment may include a plasma treatment followed by a rinse with deionized water or the like. The plasma treatment may be performed in a vacuum environment at a temperature in a range of about 20° C. to about 300° C. A combination of oxygen and hydrogen, a combination of carbon dioxide and hydrogen, a combination of nitrous oxide and hydrogen, or the like, may be used as source for the plasma. In some embodiments, the surface treatment may include a wet chemical treatment followed by a rinse with deionized water or the like. The wet chemical treatment may be performed by apply an oxidizing chemical to the surfaces of the first bonding layer 152A and the second bonding layer 152B. The oxidizing chemical may include a combination of sulfuric acid and hydrogen peroxide at a low temperature (e.g., in a range of about 10° C. to about 70° C.), a combination of sulfuric acid and hydrogen peroxide at a high temperature (e.g., in a range of about 70° C. to about 200° C.), hydrogen peroxide, or the like.

The dielectric-to-dielectric bonding process continues with step 254 of aligning the carrier substrate 150 with the front-side interconnect structure 120 and pressing the two against each other to initiate a pre-bonding between the first bonding layer 152A and the second bonding layer 152B. The pre-bonding may be performed at room temperature (e.g., between about 21° C. and about 25° C.). During the pre-bonding hydrogen bonds may be formed between the water molecules on the surface of the first bonding layer 152A and the water molecules on the surface of the second bonding layer 152B.

Subsequently, in step 256 of the dielectric-to-dielectric bonding process, an annealing may be performed to remove water molecules from surfaces of the first bonding layer 152A and the second bonding layer 152B in the form of steam. The annealing may induce the formation of covalent bonds between the titanium atoms and the oxygen atoms on the surface of the first bonding layer 152A, and the oxygen atoms and the titanium atoms on the surface of the second bonding layer 152B, respectively. As a result, titanium-oxygen-titanium (or metal-oxygen-metal) covalent bonds may be formed and bond the surfaces of the first bonding layer 152A and the second bonding layer 152B. The bond strength between the first bonding layer 152A and the second bonding layer 152B may be greater than 1.2 J/m², which may lead to effective adherence of the carrier substrate 150 to the front-side interconnect structure 120. The annealing process may be performed at a temperature of about 250° C. to about 400° C., which may cause the first base layer 151A to transition from an amorphous structure to a crystalline structure, as described in greater detail below. The annealing process may be performed for about a time in a range of about 30 seconds to about 3 hours.

The annealing may also induce aggregation of the first nano-particles 153A in the first bonding layer 152A to form first nano-particle clusters 155A and aggregation of the second nano-particles 153B in the second bonding layer 152B to form second nano-particle clusters 155B. The first nano-particle clusters 155A and the second nano-particle clusters 155B may be also referred to as the first nano-particle aggregates 155A and the second nano-particle aggregates 155B, respectively. The first nano-particle clusters 155A and the second nano-particle clusters 155B may remain embedded in the first bonding layer 152A and the second bonding layer 152B, respectively, after the annealing. The annealing may further induce crystallization of the first base layer 151A and the second base layer 151B, which may increase the thermal conductivities of the first base layer 151A and the second base layer 151B. In some embodiments, the first base layer 151A and the second base layer 151B may have an anatase crystal structure after the annealing.

After bonding, the first bonding layer 152A and second bonding layer 152B may be collectively referred to as a bonding layer 152. It should be appreciated that the bonding layer 152 may include an internal interface where the first bonding layer 152A and the second bonding layer 152B meet, as shown in FIG. 22E. The first bonding layer 152A may have a first thermal conductivity in a range of about 20 W/m·K to about 80 W/m·K. The second bonding layer 152B may have a second thermal conductivity in a range of about 20 W/m·K to about 80 W/m·K. As a result, the bonding layer 152 may have a third thermal conductivity in a range of about 20 W/m·K to about 80 W/m·K. Such a range may lead to effective heat transfer from the transistor structures 109 where heat may be generated to the carrier substrate 150 where heat may be dissipated via the bonding layer 152.

The composite material used in first bonding layer 152A and the second bonding layer 152B may have various benefits. The first base layer 151A and the second base layer 151B allows for direct bonding (e.g., dielectric-to-dielectric bonding between the metal oxide materials of the first and second base layers 151A/151B) of the carrier substrate 150 to the front-side interconnect structure 120 as well as effective heat transfer from the transistor structures 109 to the carrier substrate 150 due to the high thermal conductivities of the first base layer 151A and the second base layer 151B. The heat transfer capability of the first base layer 151A and the second base layer 151B may be further improved by embedding the first nano-particles 153A and the second nano-particles 153B with higher thermal conductivities in the first base layer 151A and the second base layer 151B, respectively. As a result, more effective transfer heat from the transistor structures 109 to the carrier substrate 150 may be achieved, thereby improving the performance and reliability of the completed integrated circuit die during operation.

Figures 22A, 22B:
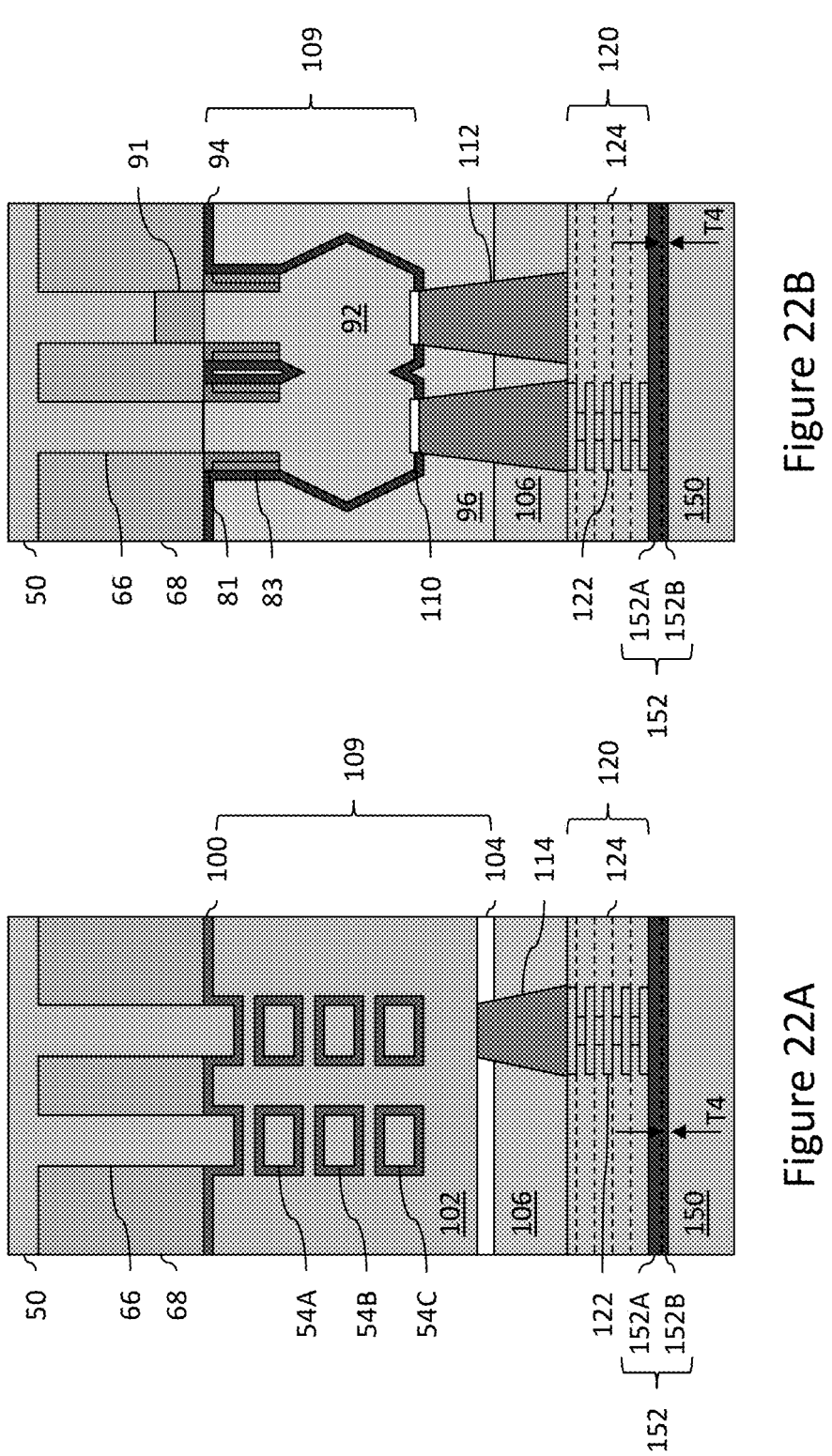
Figure 22C:
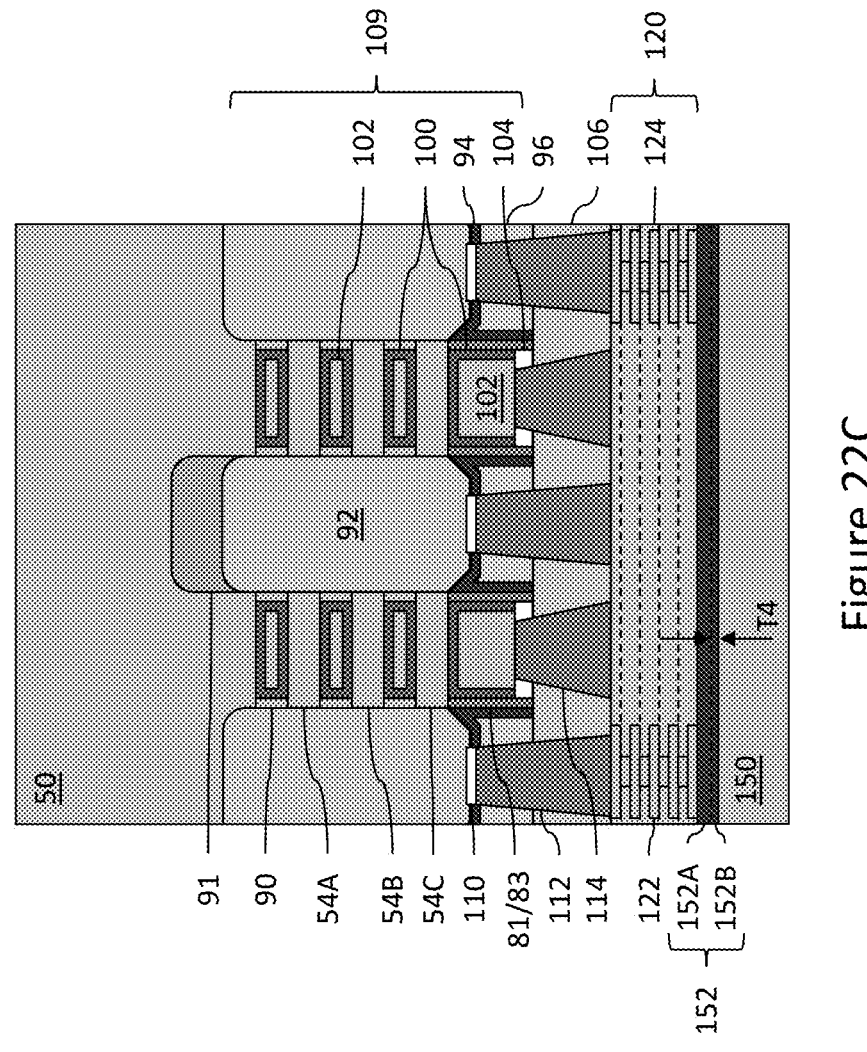
Figure 22D:
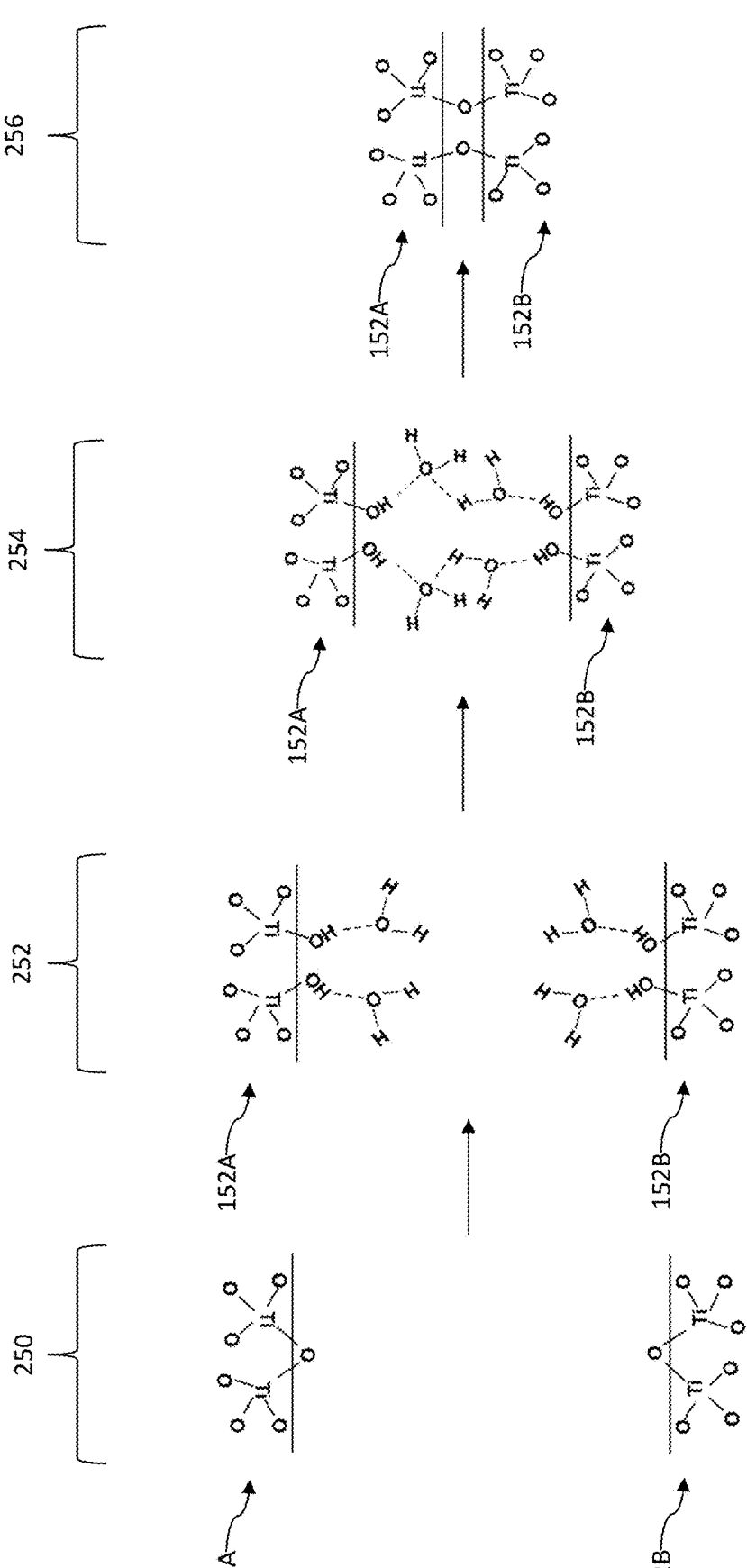
Figure 22E:
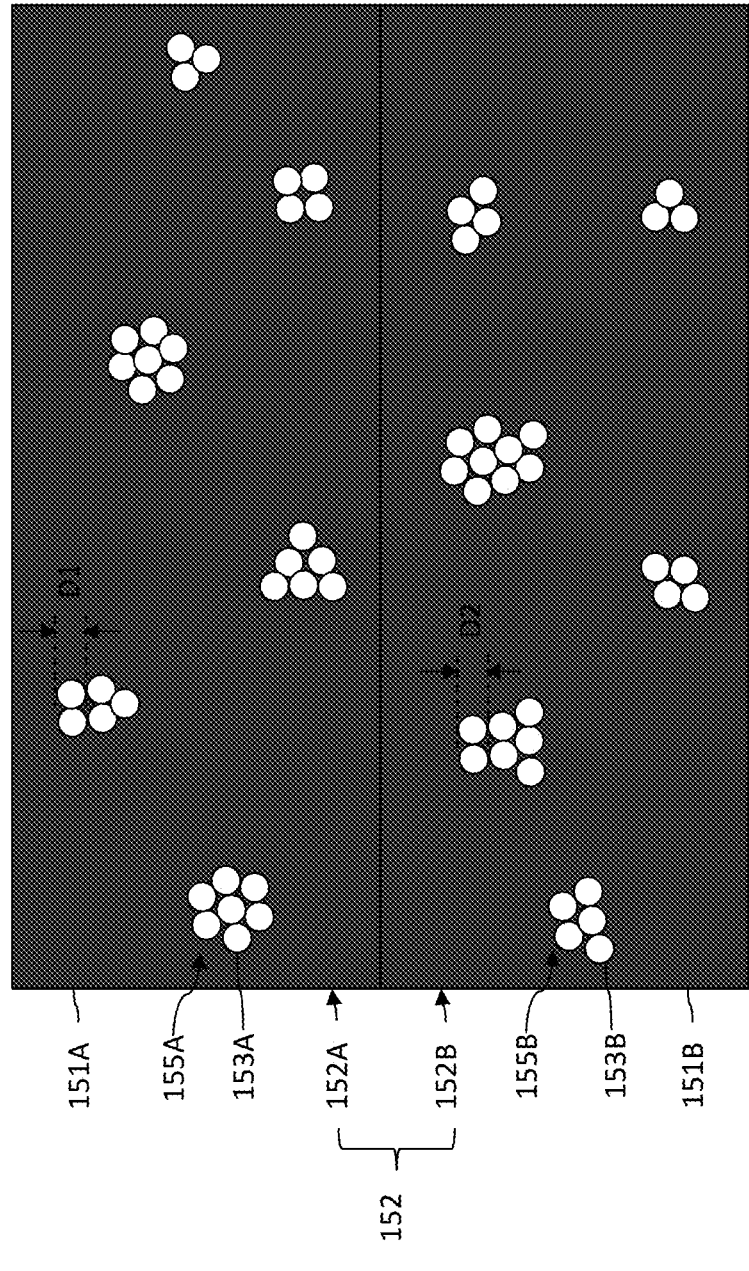

Further in FIGS. 22A through 22C, after the carrier substrate 150 is bonded to the front-side interconnect structure 120, the device may be flipped such that a back-side of the transistor structures 109 faces upwards. The back-side of the transistor structures 109 may refer to a side opposite to the front-side of the transistor structures 109 on which the active devices are formed.

Figures 23A, 23B:
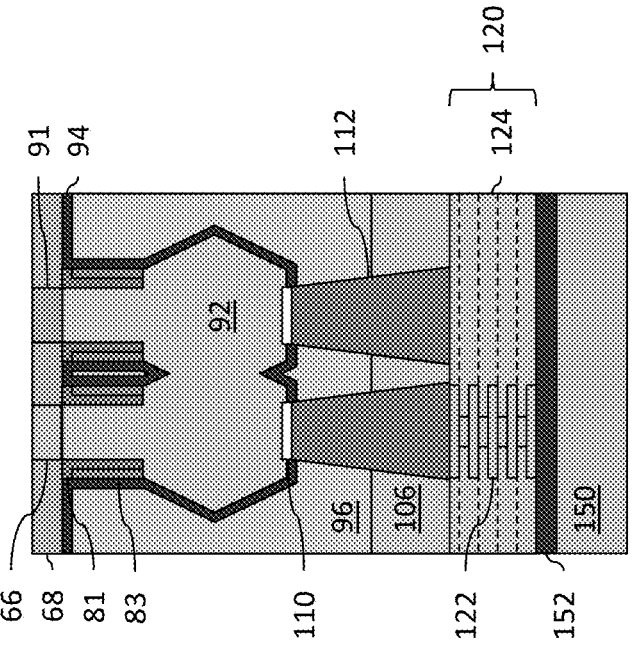
Figure 23C:
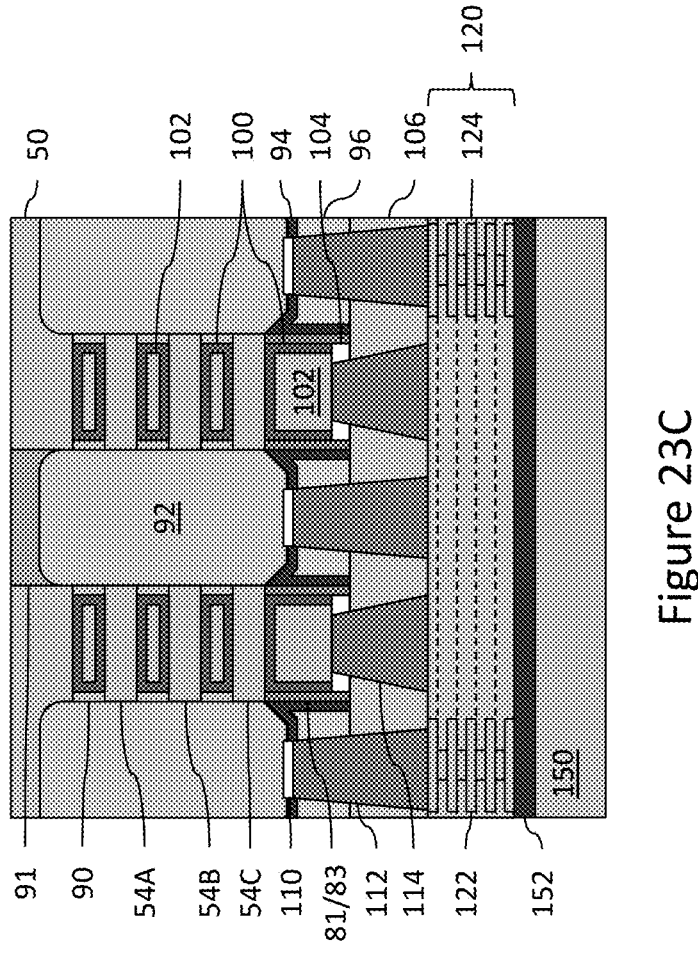

In FIGS. 23A through 23C, a thinning process may be applied to the back-side of the substrate 50. The thinning process may comprise a planarization process (e.g., a mechanical grinding, a CMP, or the like), an etch-back process, a combination thereof, or the like. The thinning process may expose surfaces of the first epitaxial materials 91 opposite the front-side interconnect structure 120. Further, a portion of the substrate 50 may remain over the gate structures (e.g., the gate electrodes 102 and the gate dielectric layers 100) and the nanostructures 55 after the thinning process. As illustrated in FIGS. 23A through 23C, back-side surfaces of the substrate 50, the first epitaxial materials 91, the STI regions 68, and the fins 66 may be level with one another following the thinning process.

Figure 24B:
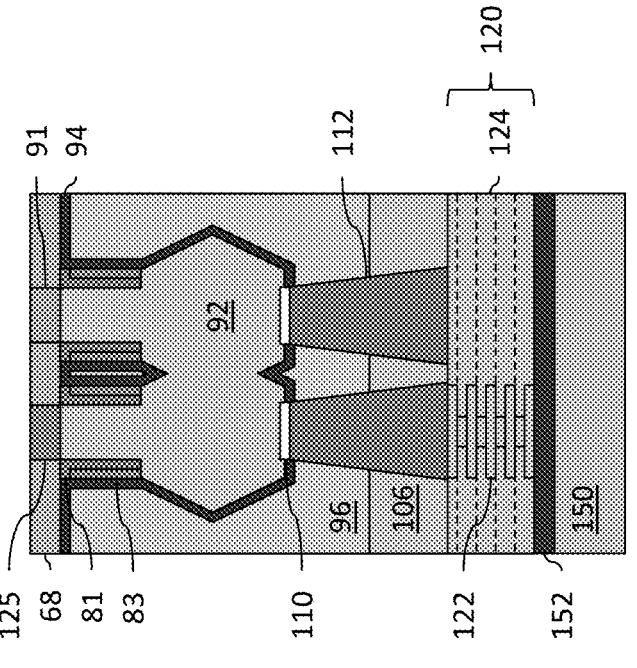
Figure 24A:
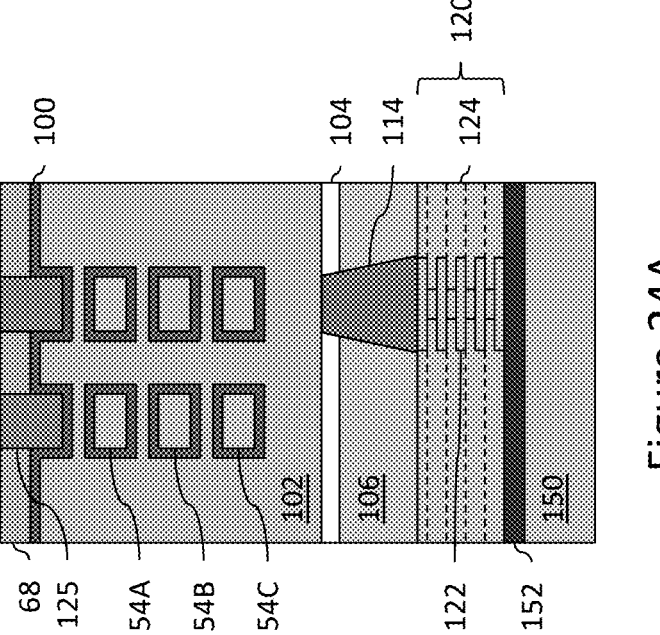
Figure 24C:
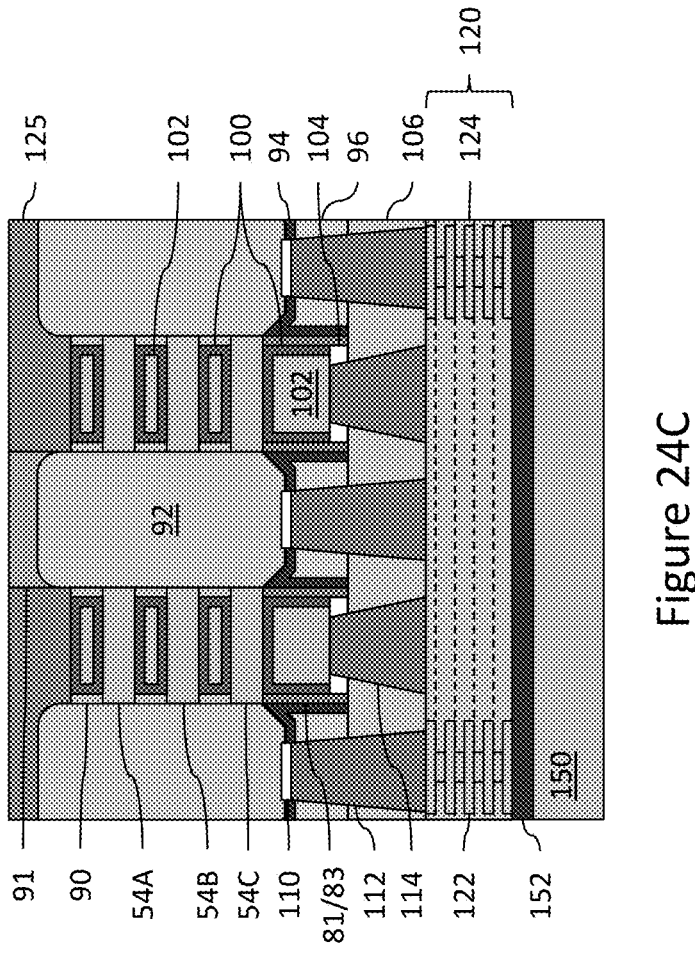

In FIGS. 24A through 24C, remaining portions of the fins 66 and the substrate 50 are removed and replaced with a second dielectric layer 125. The fins 66 and the substrate 50 may be etched using a suitable etching process, such as an isotropic etching process (e.g., a wet etching process), an anisotropic etching process (e.g., a dry etching process), or the like. The etching process may be one that is selective to the material of the fins 66 and the substrate 50 (e.g., etches the material of the fins 66 and the substrate 50 at a faster rate than the material of the STI regions 68, the gate dielectric layers 100, the epitaxial source/drain regions 92, and the first epitaxial materials 91). After etching the fins 66 and the substrate 50, surfaces of the STI regions 68, the gate dielectric layers 100, the epitaxial source/drain regions 92, and the first epitaxial materials 91 may be exposed.

The second dielectric layer 125 is then deposited on the back-side of the transistor structures 109 in recesses formed by removing the fins 66 and the substrate 50. The second dielectric layer 125 may be deposited over the STI regions 68, the gate dielectric layers 100, and the epitaxial source/drain regions 92. The second dielectric layer 125 may physically contact surfaces of the STI regions 68, the gate dielectric layers 100, the epitaxial source/drain regions 92, and the first epitaxial materials 91. The second dielectric layer 125 may be substantially similar to the second ILD 106, described above with respect to FIGS. 18A through 18C. For example, the second dielectric layer 125 may be formed of a like material and using a like process as the second ILD 106. As illustrated in FIGS. 24A through 24C, a CMP process or the like may be used to remove material of the second dielectric layer 125 such that top surfaces of the second dielectric layer 125 are level with top surfaces of the STI regions 68 and the first epitaxial materials 91.

Figure 25A:
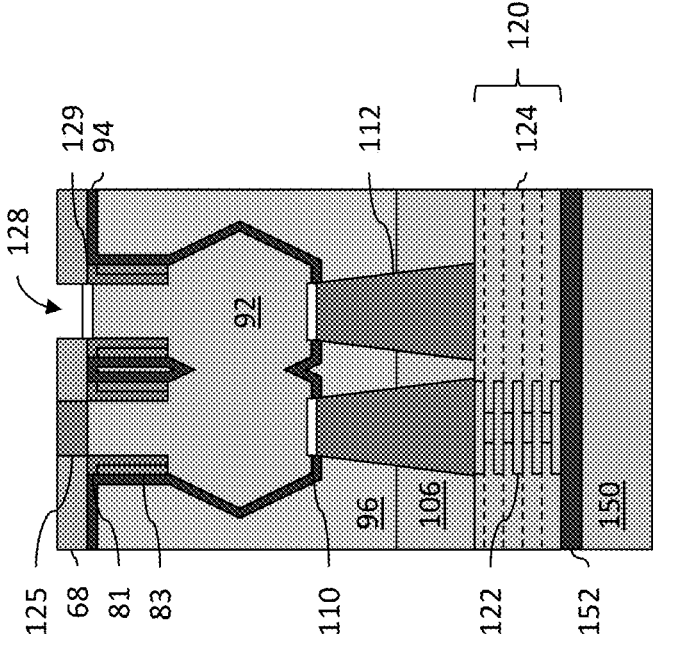
Figure 25B:
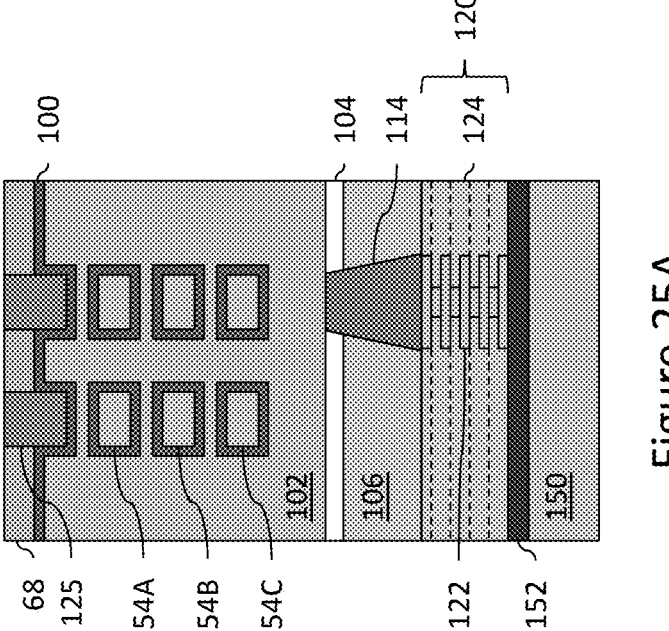
Figure 25C:
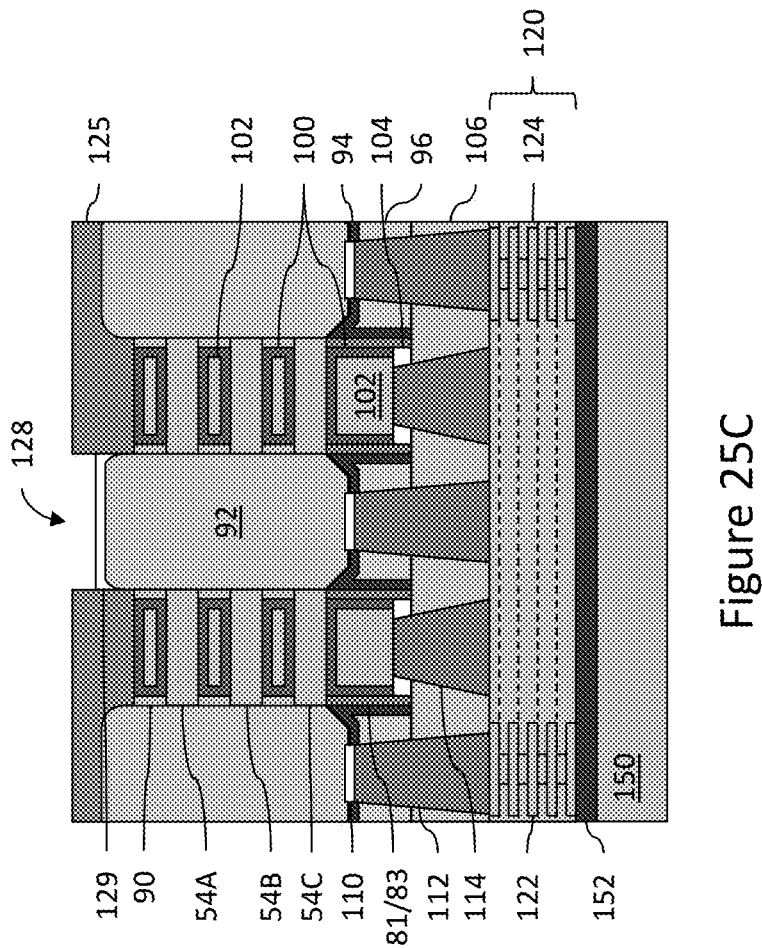

In FIGS. 25A through 25C, the first epitaxial materials 91 are removed to form fifth recesses 128 and second silicide regions 129 are formed in the fifth recesses 128. The first epitaxial materials 91 may be removed by a suitable etching process, which may be an isotropic etching process, such as a wet etching process. The etching process may have a high etch selectivity to materials of the first epitaxial materials 91. As such, the first epitaxial materials 91 may be removed without significantly removing materials of the second dielectric layer 125, the STI regions 68, or the epitaxial source/drain regions 92. In the embodiments where the first epitaxial materials 91 and the epitaxial source/drain regions 92 each comprise silicon germanium, a germanium concentration of each of the first epitaxial materials 91 and the epitaxial source/drain regions 92 may be varied and selected to achieve this etch selectivity. The fifth recesses 128 may expose sidewalls of the STI regions 68, back-side surfaces of the epitaxial source/drain regions 92, and sidewalls of the second dielectric layer 125.

Second silicide regions 129 may then be formed in the fifth recesses 128 on back-sides of the epitaxial source/drain regions 92. The second silicide regions 129 may be similar to the first silicide regions 110, described above with respect to FIGS. 19A through 19C. For example, the second silicide regions 129 may be formed of a like material and using a like process as the first silicide regions 110.

Figure 26B:
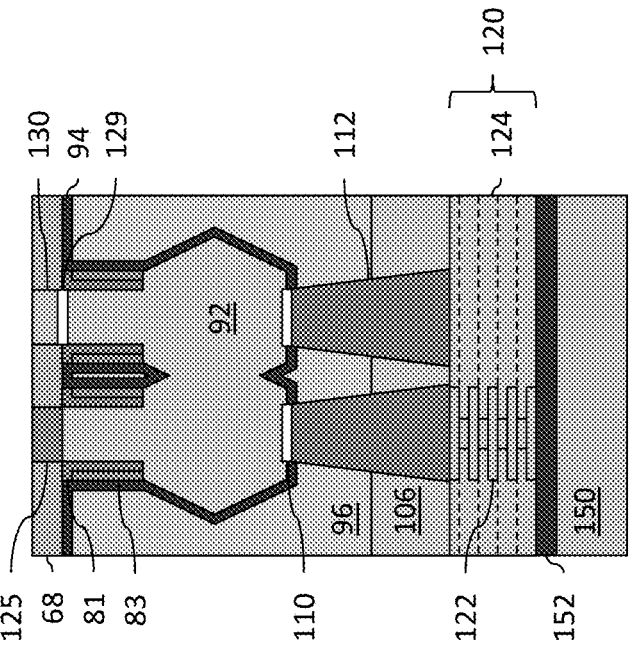
Figure 26A:
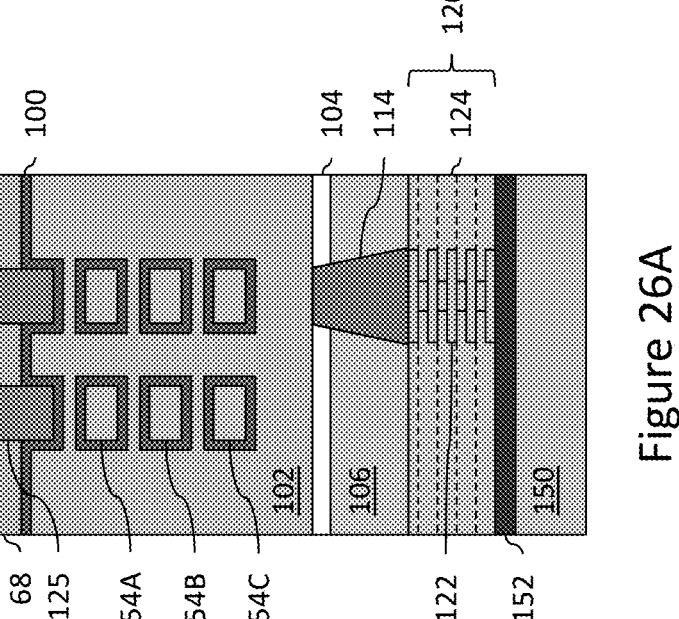
Figure 26C:
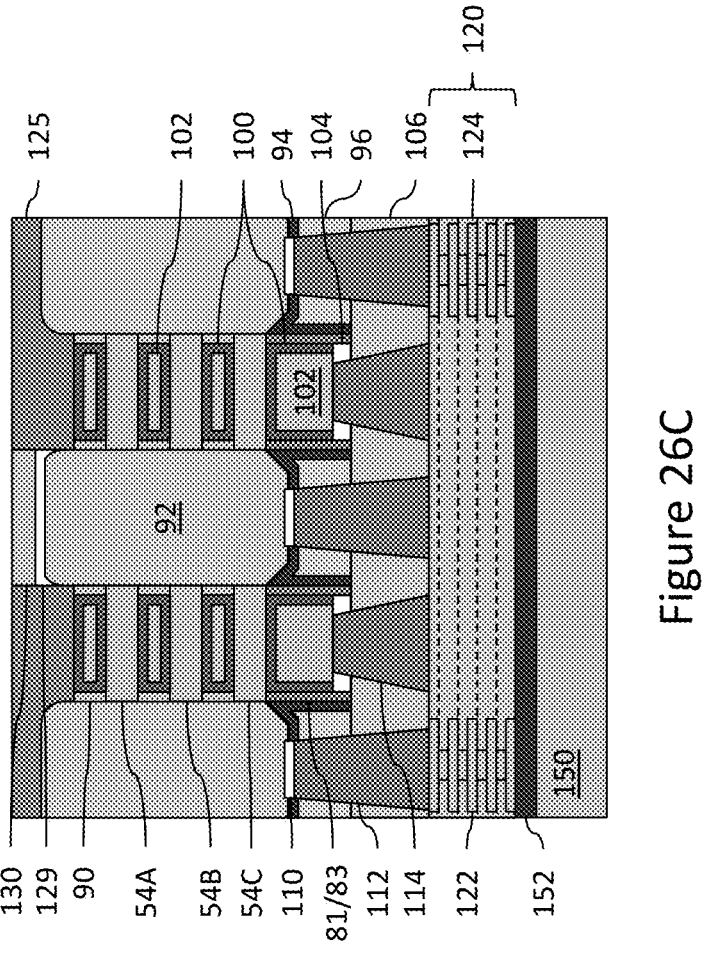

In FIGS. 26A through 26C, back-side vias 130 are formed in the fifth recesses 128. The back-side vias 130 may extend through the second dielectric layer 125 and the STI regions 68 and may be electrically coupled to the epitaxial source/drain regions 92 through the second silicide regions 129. The back-side vias 130 may be similar to the source/drain contacts 112, described above with respect to FIGS. 20A through 20C. For example, the back-side vias 130 may be formed of a like material and using a like process as the source/drain contacts 112.

Figure 27A:
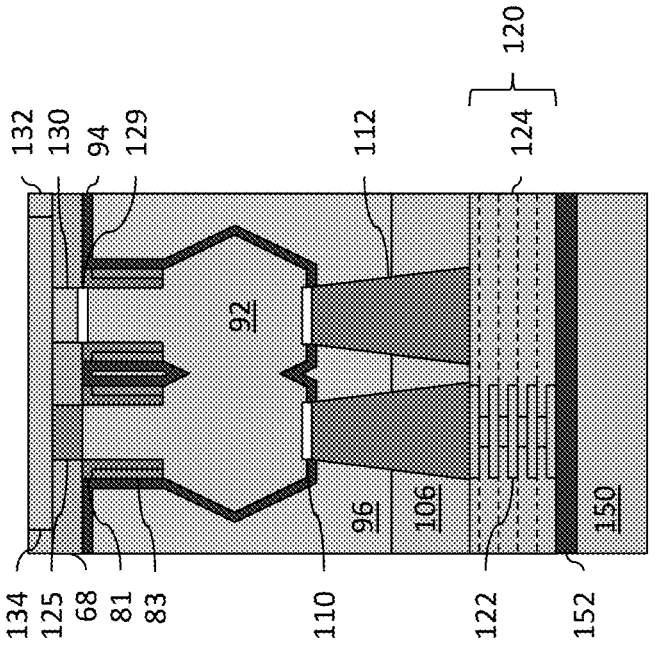
Figure 27B:
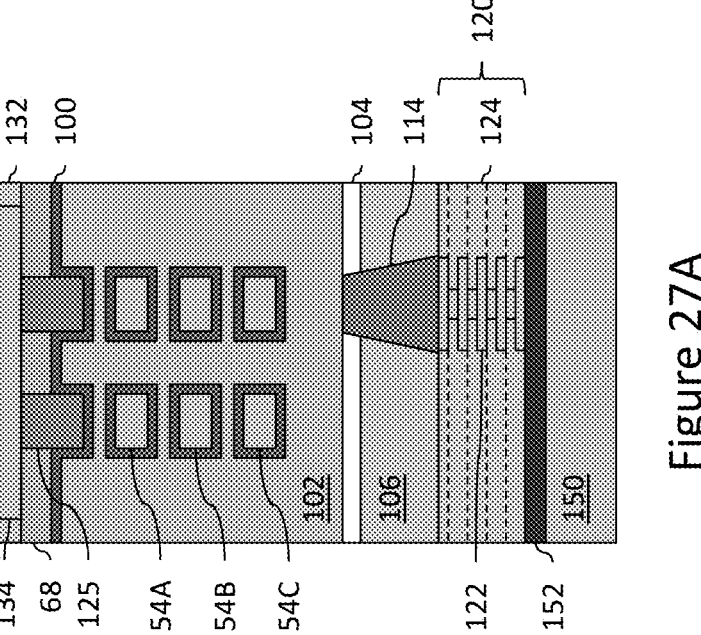
Figure 27C:
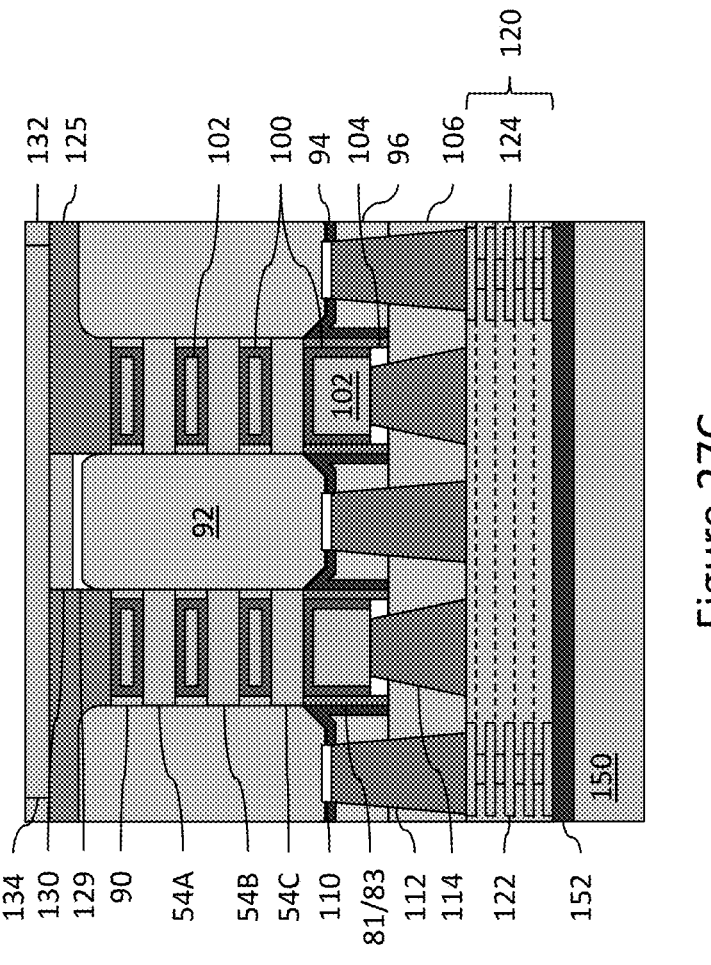

In FIGS. 27A through 27C, conductive lines 134 and a third dielectric layer 132 are formed over the second dielectric layer 125, the STI regions 68, and the back-side vias 130. The third dielectric layer 132 may be similar to the second dielectric layer 125. For example, third dielectric layer 132 may be formed of a like material and using a like process as the second dielectric layer 125.

The conductive lines 134 are formed in the third dielectric layer 132. Forming the conductive lines 134 may include patterning recesses in the third dielectric layer 132 using a combination of photolithography and etching processes, for example. A pattern of the recesses in the third dielectric layer 132 may correspond to a pattern of the conductive lines 134. The conductive lines 134 are then formed by depositing a conductive material in the recesses. In some embodiments, the conductive lines 134 comprise a metal layer, which may be a single layer or a composite layer comprising a plurality of sub-layers formed of different materials. In some embodiments, the conductive lines 134 comprise copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer include titanium, titanium nitride, titanium oxide, tantalum, tantalum nitride, titanium oxide, or the like. The conductive lines 134 may be formed using, for example, CVD, ALD, PVD, plating or the like. The conductive lines 134 are physically and electrically coupled to the epitaxial source/drain regions 92 through the back-side vias 130 and the second silicide regions 129. A planarization process (e.g., a CMP, a grinding, an etch-back, or the like) may be performed to remove excess portions of the conductive lines 134 formed over the third dielectric layer 132.

In some embodiments, the conductive lines 134 are power rails, which are conductive lines that electrically connect the epitaxial source/drain regions 92 to a reference voltage, a supply voltage, or the like. By placing power rails on a back-side of the resulting semiconductor die rather than on a front-side of the semiconductor die, advantages may be achieved. For example, a gate density of the nano-FETs and/or interconnect density of the front-side interconnect structure 120 may be increased. Further, the back-side of the semiconductor die may accommodate wider power rails, reducing resistance and increasing efficiency of power delivery to the nano-FETs. For example, a width of the conductive lines 134 may be at least twice a width of first level conductive lines (e.g., first conductive features 122) of the front-side interconnect structure 120.

Figures 28A, 28B:
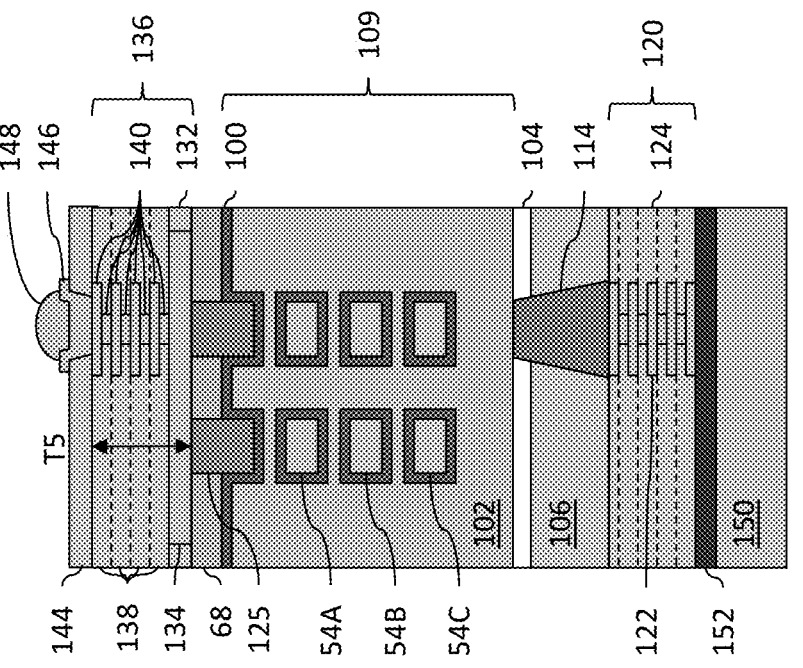
Figure 28C:
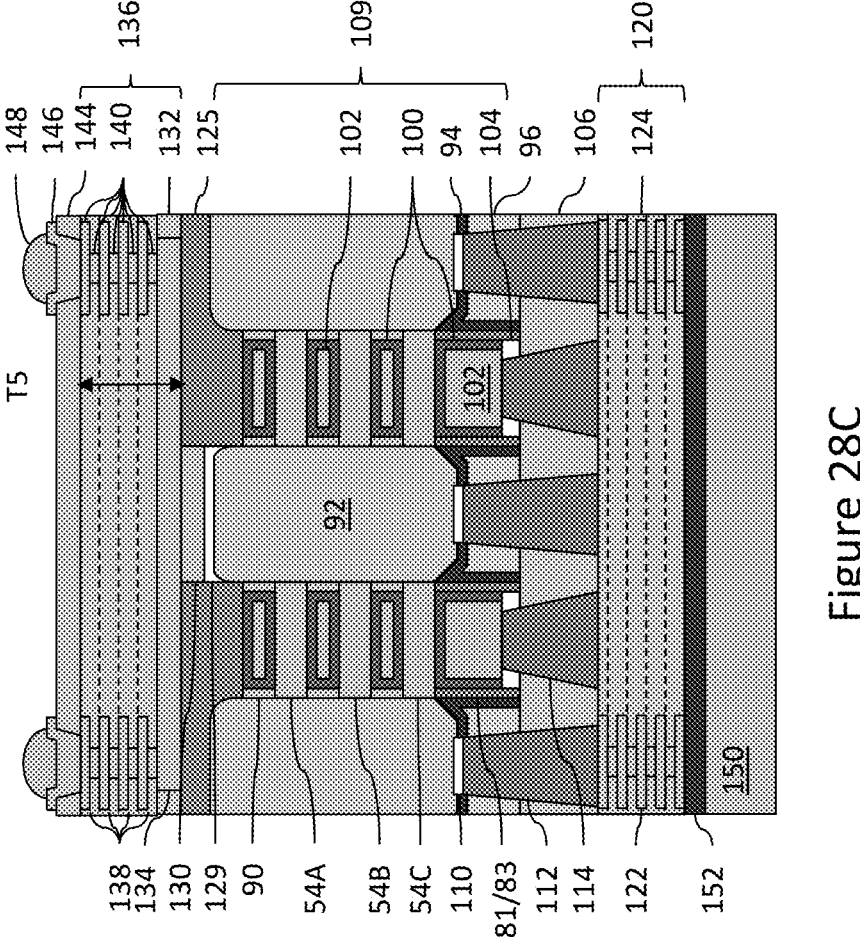

In FIGS. 28A through 28C, remaining portions of a back-side interconnect structure 136 are formed over the dielectric layer 132 and the conductive lines 134. The back-side interconnect structure 136 may be referred to as a back-side interconnect structure because it is formed on a back-side of the device layer in which transistor structures 109 are disposed (e.g., a side of the transistor structures opposite the gate electrodes 102). The back-side interconnect structure 136 may comprise the second dielectric layer 125, the third dielectric layer 132, the back-side vias 130, and the conductive lines 134.

The remaining portions of the back-side interconnect structure 136 may comprise materials and be formed using processes the same as or similar to those used for the front-side interconnect structure 120 (see FIGS. 21A through 21C). In particular, the back-side interconnect structure 136 may comprise stacked layers of second conductive features 140 formed in fourth dielectric layers 138. The second conductive features 140 may include routing lines (e.g., for routing to and from subsequently formed contact pads and external connectors). The second conductive features 140 may further be patterned to include one or more embedded passive devices such as, resistors, capacitors, inductors, or the like. The embedded passive devices may be integrated with the conductive lines 134 (e.g., the power rail) to provide circuits (e.g., power circuits) on the back-side of the nano-FETs. The fourth dielectric layers 138 may be formed of similar materials using similar processes as the first dielectric layers 124, and the second conductive features 140 may be formed of similar materials using similar processes as the first conductive features 122. In some embodiments, the back-side interconnect structure 136 has an overall thickness T5 in a range of about 0.1 μm to about 5 μm.

In FIGS. 29A through 29C, a passivation layer 144, UBMs 146, and external connectors 148 are formed over the back-side interconnect structure 136. The passivation layer 144 may comprise polymers such as PBO, polyimide, BCB, or the like. Alternatively, the passivation layer 144 may include non-organic dielectric materials such as silicon oxide, silicon nitride, silicon carbide, silicon oxynitride, or the like. The passivation layer 144 may be deposited by, for example, CVD, PVD, ALD, or the like.

The UBMs 146 are formed through the passivation layer 144 to the conductive lines 140 in the back-side interconnect structure 136 and external connectors 148 are formed on the UBMs 146. The UBMs 146 may comprise one or more layers of copper, nickel, gold, or the like, which are formed by a plating process, or the like. The external connectors 148 (e.g., solder balls) are formed on the UBMs 146. The formation of the external connectors 148 may include placing solder balls on exposed portions of the UBMs 146 and reflowing the solder balls. In some embodiments, the formation of the external connectors 148 includes performing a plating step to form solder regions over the topmost conductive lines 140C and then reflowing the solder regions. The UBMs 146 and the external connectors 148 may be used to provide input/output connections to other electrical components, such as, other device dies, redistribution structures, printed circuit boards (PCBs), motherboards, or the like. The UBMs 146 and the external connectors 148 may also be referred to as back-side input/output pads that may provide signal, supply voltage, and/or ground connections to the nano-FETs described above.

Subsequently, a singulation process may be applied along scribe lines to separate individual integrated circuit dies 200 of the wafer from each other. In this manner, an integrated circuit die 200 having a front-side interconnect structure 120, a device layer comprising transistor structures 109, and a back-side interconnect structure 136 may be manufactured.

The embodiments of the present disclosure have some advantageous features. By utilizing composite material with high thermal conductivities for the first bonding layer 152A and the second bonding layer 152B, heat generated in the integrated circuit die 200 may be effectively transferred to the carrier substrate 150 through the bonding layer 152 and be dissipated in the carrier substrate 150. As a result, the performance and reliability of the integrated circuit die during operation may be improved.

In an embodiment, a device includes a device layer including a first transistor; a first interconnect structure on a first side of the device layer; a first material layer on the first interconnect structure, wherein the first material layer includes first metal nano-particles; and a second material layer bonded to the first material layer, wherein the second material layer includes second metal nano-particles, and wherein the first material layer and the second material layer share an interface. In an embodiment, the first metal nano-particles are disposed in first metal nano-particle clusters of the first material layer, wherein each of the first metal nano-particle clusters includes a plurality of the first metal nano-particles, wherein the second metal nano-particles are disposed in second metal nano-particle clusters of the second material layer, and wherein each of the second metal nano-particle clusters includes a plurality of the second metal nano-particles. In an embodiment, the first material layer has a first thermal conductivity in a range of 20 W/m·K to 80 W/m·K and wherein the second material layer has a second thermal conductivity in a range of 20 W/m·K to 80 W/m·K. In an embodiment, the first material layer and the second material layer each includes titanium oxide, aluminum oxide, nickel oxide, or zinc oxide. In an embodiment, the first metal nano-particles include silver nano-particles, ruthenium nano-particles, or niobium nano-particles. In an embodiment, the device further includes a substrate directly contacting the second material layer, wherein the substrate is directly bonded to the first interconnect structure by the first material layer and the second material layer. In an embodiment, the first metal nano-particles are disposed within a first crystalline metal oxide base layer of the first material layer, and wherein the second nano-particles are disposed within a second crystalline metal oxide base layer of the second material layer.

In an embodiment, a device includes a first transistor structure and a second transistor structure in device layer; an interconnect structure on the device layer, the first transistor structure being electrically coupled to the second transistor structure through the interconnect structure; a first bonding layer on the interconnect structure, wherein the first bonding layer includes first metal nano-particle aggregates, and wherein each of the first metal nano-particle aggregates includes first metal nano-particles; a substrate; and a second bonding layer on the substrate, wherein the second bonding layer includes second metal nano-particle aggregates, wherein each of the second metal nano-particle aggregates includes second metal nano-particles; and wherein the substrate is directly bonded to the interconnect structure by the first bonding layer and the second bonding layer. In an embodiment, the first metal nano-particles have a first thermal conductivity greater than 100 W/m·K and the second metal nano-particles have a second thermal conductivity greater than 100 W/m·K. In an embodiment, the first nano-particle aggregates are embedded in a first base layer of the first bonding layer, and wherein the second nano-particle aggregates are embedded in a second base layer of the second bonding layer. In an embodiment, the first base layer and second base layer each includes a crystalline metal oxide.

In an embodiment, a method includes forming a device layer on a semiconductor substrate, the device layer including a transistor; forming an interconnect structure over the device layer; depositing a first bonding layer on the interconnect structure, wherein the first bonding layer include first base layer and first metal nano-particles embedded in the first base layer; and directly bonding the first bonding layer to a second bonding layer on a substrate, wherein the second bonding layer include second base layer and second metal nano-particles embedded in the second base layer. In an embodiment, wherein bonding the first bonding layer to the second bonding layer includes annealing the first bonding layer and the second bonding layer after the first bonding layer and the second bonding layer are brought into contact. In an embodiment, the first base layer and the second base layer are amorphous before annealing the first bonding layer and the second bonding layer. In an embodiment, annealing the first bonding layer and the second bonding layer includes crystallizing the first base layer and the second base layer. In an embodiment, the first metal nano-particles and the second metal nano-particles diffuse and form aggregates during annealing the first bonding layer and the second bonding layer. In an embodiment, bonding the first bonding layer to the second bonding layer includes performing a surface treatment on surfaces of the first bonding layer to the second bonding layer to form hydroxyl groups on the surfaces of the first bonding layer to the second bonding layer with a plasma treatment. In an embodiment, bonding the first bonding layer to the second bonding layer includes performing a surface treatment on surfaces of the first bonding layer to the second bonding layer to form hydroxyl groups on the surfaces of the first bonding layer to the second bonding layer with wet chemical treatment. In an embodiment, the first metal nano-particles have a higher thermal conductivity than the first base layer. In an embodiment, a concentration of the first metal nano-particles is in a range of 0.1 wt. % to 10 wt. % in the first bonding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
   a device layer comprising a first transistor;

a first interconnect structure on a first side of the device layer;

a first material layer on the first interconnect structure, wherein the first material layer comprises a first base layer and first metal nano-particles, wherein the first metal nano-particles are surrounded by the first base layer, and wherein the first metal nano-particles have a higher thermal conductivity than the first base layer; and a second material layer bonded to the first material layer, wherein the second material layer comprises a second base layer and second metal nano-particles, wherein the second metal nano-particles are surrounded by the second base layer, and wherein the first material layer and the second material layer share an interface.

2. The device of claim 1, wherein the first metal nano-particles are disposed in first metal nano-particle clusters of the first material layer, wherein each of the first metal nano-particle clusters comprises a plurality of the first metal nano-particles, wherein the second metal nano-particles are disposed in second metal nano-particle clusters of the second material layer, and wherein each of the second metal nano-particle clusters comprises a plurality of the second metal nano-particles.

3. The device of claim 1, wherein the first material layer has a first thermal conductivity in a range of 20 W/m·K to 80 W/m·K and wherein the second material layer has a second thermal conductivity in a range of 20 W/m·K to 80 W/m·K.

4. The device of claim 1, wherein the first base layer and the second base layer each comprises titanium oxide, nickel oxide, or zinc oxide.

5. The device of claim 1, wherein the first metal nano-particles comprise ruthenium nano-particles or niobium nano-particles.

6. The device of claim 1, wherein the first base layer comprises a crystalline metal oxide, and wherein the second base layer comprises a crystalline metal oxide.

7. A device comprising:

a first transistor structure and a second transistor structure in a device layer;

an interconnect structure on the device layer, the first transistor structure being electrically coupled to the second transistor structure through the interconnect structure;

a first bonding layer on the interconnect structure, wherein the first bonding layer comprises first metal nano-particle aggregates, and wherein each of the first metal nano-particle aggregates comprises first metal nano-particles;

a substrate; and a second bonding layer on the substrate, wherein the second bonding layer comprises second metal nano-particle aggregates, wherein each of the second metal nano-particle aggregates comprises second metal nano-particles, wherein the first metal nano-particles and the second metal nano-particles comprise different materials, and wherein the substrate is directly bonded to the interconnect structure by the first bonding layer and the second bonding layer.

8. The device of claim 7, wherein the first metal nano-particles have a first thermal conductivity greater than 100 W/m·K and the second metal nano-particles have a second thermal conductivity greater than 100 W/m·K.

9. The device of claim 7, wherein the first metal nano-particle aggregates are embedded in a first base layer of the first bonding layer, and wherein the second metal nano-particle aggregates are embedded in a second base layer of the second bonding layer.

10. The device of claim 9, wherein the first base layer and the second base layer each comprises crystalline titanium oxide.

11. A method comprising:

forming a device layer on a semiconductor substrate, the device layer comprising a transistor;

forming an interconnect structure over the device layer;

depositing a first bonding layer on the interconnect structure, wherein the first bonding layer comprises a first base layer and first metal nano-particles embedded in the first base layer, wherein the first metal nano-particles are surrounded by the first base layer, and wherein the first base layer and the first metal nano-particles comprise different materials; and directly bonding the first bonding layer to a second bonding layer by dielectric-to-dielectric bonding, wherein the second bonding layer is on a substrate before bonding the first bonding layer to the second bonding layer, wherein the second bonding layer comprises a second base layer and second metal nano-particles embedded in the second base layer, and wherein the second metal nano-particles are surrounded by the second base layer.

12. The method of claim 11, wherein bonding the first bonding layer to the second bonding layer comprises annealing the first bonding layer and the second bonding layer after the first bonding layer and the second bonding layer are brought into contact.

13. The method of claim 12, wherein the first base layer and the second base layer are amorphous before annealing the first bonding layer and the second bonding layer.

14. The method of claim 13, wherein annealing the first bonding layer and the second bonding layer comprises crystallizing the first base layer and the second base layer.

15. The method of claim 12, wherein the first metal nano-particles and the second metal nano-particles diffuse and form aggregates during annealing the first bonding layer and the second bonding layer.

16. The method of claim 12, wherein bonding the first bonding layer to the second bonding layer comprises performing a surface treatment on surfaces of the first bonding layer to the second bonding layer to form hydroxyl groups on the surfaces of the first bonding layer to the second bonding layer with a plasma treatment.

17. The method of claim 12, wherein bonding the first bonding layer to the second bonding layer comprises performing a surface treatment on surfaces of the first bonding layer to the second bonding layer to form hydroxyl groups on the surfaces of the first bonding layer to the second bonding layer with a wet chemical treatment.

18. The method of claim 11, wherein the first metal nano-particles have a higher thermal conductivity than the first base layer.

19. The method of claim 11, wherein a concentration of the first metal nano-particles is in a range of 0.1 wt. % to 10 wt. % in the first bonding layer.

20. The device of claim 9, wherein the first metal nano-particle aggregates are electrically isolated from the substrate and the interconnect structure by the first base layer, and wherein the second metal nano-particle aggregates are electrically isolated from the substrate and the interconnect structure by the second base layer.

* * * * *